United States Patent
Kanai et al.

[11] Patent Number: 5,804,033
[45] Date of Patent: Sep. 8, 1998

[54] MICROWAVE PLASMA PROCESSING METHOD AND APPARATUS

[75] Inventors: Saburo Kanai, Hikari; Yoshinao Kawasaki, Yamaguchi-Ken; Kazuaki Ichihashi, Kudamatsu; Seiichi Watanabe, Kudamatsu; Makoto Nawata, Kudamatsu; Muneo Furuse, Kudamatsu; Tetsunori Kaji, Tokuyama, all of Japan

[73] Assignee: Hitachi, Ltd., Tokyo, Japan

[21] Appl. No.: 29,241

[22] Filed: Mar. 10, 1993

Related U.S. Application Data

[63] Continuation-in-part of Ser. No. 765,834, Sep. 26, 1991.

[30] Foreign Application Priority Data

| Sep. 26, 1990 | [JP] | Japan | 2-254162 |
| Oct. 31, 1990 | [JP] | Japan | 2-292049 |
| Dec. 18, 1990 | [JP] | Japan | 2-403054 |
| Mar. 10, 1992 | [JP] | Japan | 4-051275 |

[51] Int. Cl.$^6$ .................. H01L 21/302; H01L 21/205; H01L 21/31

[52] U.S. Cl. .................. 156/643.1; 216/69; 156/345; 315/111.41; 118/723 MW; 427/457

[58] Field of Search .................. 156/345, 643.1; 315/111.41, 111.21; 118/723 MW, 723 MA; 204/298.37, 298.38; 427/457; 216/69

[56] References Cited

U.S. PATENT DOCUMENTS

| 4,776,918 | 10/1988 | Otsubo et al. | 156/345 |
| 4,877,509 | 10/1989 | Ogawa et al. | 204/298 |
| 4,970,435 | 11/1990 | Tanaka et al. | 118/723 MR |
| 4,985,109 | 1/1991 | Otsubo et al. | 156/345 |
| 5,038,713 | 8/1991 | Kawakami et al. | 118/723 |
| 5,081,398 | 1/1992 | Asmussen et al. | 315/111.41 |
| 5,111,111 | 5/1992 | Stevens et al. | 315/111.41 |
| 5,134,965 | 8/1992 | Tokuda et al. | 156/345 |
| 5,146,138 | 9/1992 | Ootera et al. | 204/298.38 |
| 5,266,364 | 11/1993 | Tamura et al. | 427/571 |
| 5,304,277 | 4/1994 | OHara | 156/345 |

FOREIGN PATENT DOCUMENTS

| 2-081434 | 3/1990 | Japan. |
| 4-127426 | 4/1992 | Japan. |
| 4-167424 | 6/1992 | Japan. |

*Primary Examiner*—R. Bruce Breneman
*Assistant Examiner*—George Goudreau
*Attorney, Agent, or Firm*—Antonelli, Terry, Stout, & Kraus, LLP

[57] ABSTRACT

The present invention relates to a microwave plasma processing method and apparatus. According to the present invention, the microwaves are introduced into the electric discharge means in correspondence with only the traveling direction thereof, whereby uniformity in a plasma density distribution corresponding to the surface to-be-processed of the sample can be sharply enhanced, so that the sample processed by utilizing such plasma can attain an enhanced processing homogeneity within the surface to be processed. In addition, homogeneity and stability of the plasma are improved by inserting a cavity resonator between the microwave generator and plasma processing (plasma generating) chamber, and coupling the cavity resonator and plasma processing chamber such that microwaves substantially only of a desired mode (e.g., $TE_{11}$) pass into the plasma processing chamber. Such coupling to provide microwaves substantially only of circular $TE_{11}$ mode can be achieved by providing the coupling such that a ratio of diameter of the discharge block, where the plasma is generated, to the diameter of the cavity resonator, is 0.345.

6 Claims, 20 Drawing Sheets

MICROWAVE PLASMA PROCESSING METHOD AND APPARATUS

BACKGROUND OF THE INVENTION

This application is a Continuation-in-Part application of application Ser. No. 07/765,834, filed Sep. 26, 1991, the contents of which are incorporated herein by reference in their entirety.

The present invention relates to a microwave plasma processing method and apparatus. More particularly, it relates to a microwave plasma processing method and apparatus which are well suited to subject samples, such as semiconductor device substrates, to an etching process, a film forming process, etc. by the use of a microwave plasma processor of the type wherein a waveguide section includes electric discharge means isolated from a waveguide for the propagation of microwaves, which electric discharge means has a plasma generation region therein. The present invention is also directed to such a microwave plasma processor wherein the mode of microwave used is selected to be a predetermined mode.

As microwave plasma processing techniques, there have been known examples as disclosed in "HITACHI REVIEW", Vol. 71, No. 5, pp. 33–38 (1989) and Japanese Patent Publication No. 34461/1978, wherein an electric discharge tube made of quartz is disposed inside a waveguide for propagating microwaves, plasma is generated within the electric discharge tube by the synergy of a microwave electric field and a magnetic field, and a semiconductor wafer set in a processing chamber is subjected to an etching process by utilizing the plasma.

Also, there have been known examples as disclosed in Japanese Patent Laid-Open Nos. 103340/1984 and 25420/1989, wherein an electric discharge tube made of quartz is disposed inside a circular waveguide for propagating microwaves, plasma is generated within the electric discharge tube under the action of a microwave electric field and a magnetic field, and a sample, such as semiconductor device substrate, set in a processing chamber is subjected to an etching process or a film forming process by utilizing the plasma.

SUMMARY OF THE INVENTION

In the processing of a sample, such as a semiconductor device substrate, utilizing plasma, unless a plasma density distribution, corresponding to the surface of the sample to be processed, is made uniform, homogeneity in the process cannot be ensured within the surface to-be-processed of the sample. In the above-described prior art, plasma was not generated homogeneously and effectively because the modes of microwaves propagated in a discharge tube were not considered.

In addition, the inventors of the present invention have found out that, in an etching process for an insulator, for example, silicon oxide film, ions in the plasma are higher in the degree of contribution to etching than active neutral particles such as radicals because the former is higher in energy than the latter. However, when the energy of the ions is too high, unfavorably ion damages are inflicted on the sample. From the viewpoint of preventing ion damages of the sample, accordingly, the plasma should preferably be at an energy level adapted to ionize a processing gas. For the purpose of raising a processing speed, it is required to enhance an ionization proportion, in other words, a plasma density.

In this regard, in the aforementioned prior art techniques of both types, namely, microwave plasma processing techniques of the former type, called the type having a magnetic field, and those of the latter type, called the type not having a magnetic field, a waveguide section includes an electric discharge tube formed of quartz, i.e., a microwave transmitting material, and the interior of the electric discharge tube is filled with the plasma, while the exterior thereof is the atmospheric air. Accordingly, a waveguide is formed of the microwave transmitting material, and the microwaves having been propagated by the waveguide are introduced into the plasma within the electric discharge tube, not only in the traveling direction thereof, but also in the sideward directions of the electric discharge tube, etc. Therefore, the traveling state of the microwaves in the plasma becomes very complicated.

Thus, the prior art still has the problem to-be-solved that the uniformity of the plasma density distribution corresponding to the surface to-be-processed of the sample is spoiled, so the homogeneity of the process within the surface to-be-processed of the sample degrades.

On the other hand, enhancement of plasma density as mentioned above is required for raising the processing speed.

This is coped with by a measure such as changing a processing pressure or increasing the input power of the microwaves. The prior art techniques, however, undergo limitations in enhancing the processing speed owing to the heightened plasma density. Incidentally, as the power of the microwaves is increased more, so as to increase processing speed, the uniformity of the plasma density distribution corresponding to the surface to-be-processed of the sample is spoiled more, and influence on the degradation of the homogeneity of the process within the surface to-be-processed of the sample becomes more serious.

An object of the present invention is to provide a microwave plasma generating method and apparatus, and a method and apparatus for processing (e.g., coating and/or etching) a sample surface using such plasma, which can enhance and ensure the homogeneity of processing of the surface to-be-processed of a sample.

A further object of the present invention is to provide a microwave plasma processing method, and apparatus, wherein microwaves are provided to form the plasma such that a homogeneous and high-density plasma is formed at the surface to-be-processed of a sample.

A still further object of the present invention is to provide a microwave plasma processing method, and apparatus, wherein mode of microwave supplied to the plasma generating chamber is considered in forming a homogeneous and high-density plasma.

A still further object of the present invention is to provide a microwave plasma processing method, and apparatus, wherein microwaves having a predetermined mode are supplied (more particularly, wherein microwaves of a predetermined mode are propagated, and microwaves of a predetermined mode, from the propagated microwaves, are supplied) to a chamber in which the plasma is formed, so as to form a homogeneous and high-density plasma.

A still further object of the present invention is to provide a microwave plasma generating method, and apparatus, which can generate a homogeneous and high-density plasma, and make speedy and homogeneous plasma processing possible, by stably supplying microwaves of a circular $TE_{11}$ mode into a discharge tube, e.g., where the plasma is generated, which discharge tube is a portion of a processing chamber; and to provide a microwave plasma processing method and apparatus, for processing a sample surface using such generated plasma.

Other objects of the present invention will become apparent from the ensuing detailed description.

The aforementioned objects are accomplished by a microwave plasma generating method comprising the step of oscillating microwaves; the step of introducing the microwaves in correspondence with only a traveling direction thereof, into electric discharge means isolated from a waveguide for propagation of the microwaves and having a plasma generation region therein; the step of evacuating for pressure reduction the interior of said electric discharge means; the step of introducing a processing gas into said electric discharge means; and the step of turning the processing gas introduced in said electric discharge means into a plasma under, at least, an action of an electric field of the microwaves. Such objects are also accomplished by the processing method including the additional step of processing a surface to-be-processed of a sample with the plasma.

These objects are also accomplished by a microwave plasma generating apparatus wherein a waveguide section includes electric discharge means isolated from a waveguide for propagation of microwaves, the electric discharge means having a plasma generation region therein; and wherein a part of said electric discharge means corresponding to a traveling direction of the microwaves is formed of a microwave transmitting material, while the other part thereof is formed of microwave non-transmitting material. That part of the electric discharge means included in the waveguide section which corresponds to the traveling direction of the microwaves, the electric discharge means being isolated from the waveguide for the propagation of the microwaves and having the plasma generation region therein, is formed of the microwave transmitting material, while the other part thereof is formed of the microwave non-transmitting material. Such objects are further accomplished by a microwave plasma processing apparatus wherein a sample to be processed by the plasma is positioned in the electric discharge means and subjected to the plasma.

Accordingly, the microwaves having been propagated by the waveguide are introduced into the electric discharge means through only the part of the electric discharge means formed of the microwave transmitting material. Therefore, as compared with those in the case where the microwaves are introduced also from the side surfaces etc., as in the prior art, the uniformity of the plasma density distribution corresponding to the surface to-be-processed of the sample is sharply enhanced, and the homogeneity of the process within the surface to-be-processed of the sample utilizing the plasma is enhanced.

The foregoing objects are further accomplished by installing a microwave oscillator for propagating microwaves of a predetermined mode (e.g., a $TE_{12}$ oscillator) in a transmitting portion of microwaves, the oscillator (cavity resonator) being coupled to the electric discharge means (plasma generating chamber) so as to transmit microwaves from the oscillator to the electric discharge means (in particular, to a discharge tube, where the plasma is generated, of the electric discharge means).

The foregoing objects are further achieved through use of the cavity resonator coupled to the electric discharge means, with the coupling therebetween being selected so that microwaves of substantially only a desired mode are transmitted from the resonator to the electric discharge means. The coupling can be an opening between the cavity resonator and electric discharge means, with, for example, a microwave transmitting window covering the opening. Where such opening has a same configuration and size (area in plan) as a discharge tube (of the electric discharge means) where the plasma is generated, the discharge tube can have its dimensions selected, relative to dimensions of the cavity resonator, so that microwaves of substantially only a desired mode (e.g., $TE_{11}$) are transmitted from the cavity resonator to the electric discharge means.

For example, a diametral ratio of (1) the discharge tube to (2) a $TE_{12}$ oscillator is selected to be a predetermined value (e.g., 0.345) so as to supply microwaves of a predetermined mode (e.g., $TE_{11}$) to the processing chamber; an axis of the $TE_{12}$ oscillator coincides with an axis of the discharge tube, and said $TE_{12}$ oscillator and said discharge tube are arranged in the above-described order in a microwave transmitting direction so as to supply microwaves of, e.g., $TE_{11}$ mode stably into the discharge tube.

In the example in the prior paragraph, the $TE_{11}$ mode, which is basic to the $TE_{12}$ mode, is obtained from the $TE_{12}$ mode output of the $TE_{12}$ oscillator. More generally, a component of the mode output of the oscillator, which is lower in order than the oscillator output mode, is extracted from the output of the oscillator and led to a discharge tube.

BRIEF DESCRIPTION OF THE DRAWINGS

FIGS. 23 to 26 illustrate a ninth embodiment of the present invention, in which FIGS. 23 and 25 are vertical sectional views each showing portions of microwave plasma etching equipment; FIG. 24 is a graph showing a relationship between the temperature of an electric discharge block and the relative selection ratio of a silicon oxide film in the etching equipment in FIG. 23; and FIG. 26 is a graph showing a relationship between the number of processed samples and the variation, with time, of the relative selection ratio in the etching equipment in FIG. 25.

DETAILED DESCRIPTION OF THE INVENTION

Now, the first embodiment of the present invention will be described with reference to FIG. 1.

Figure 1:
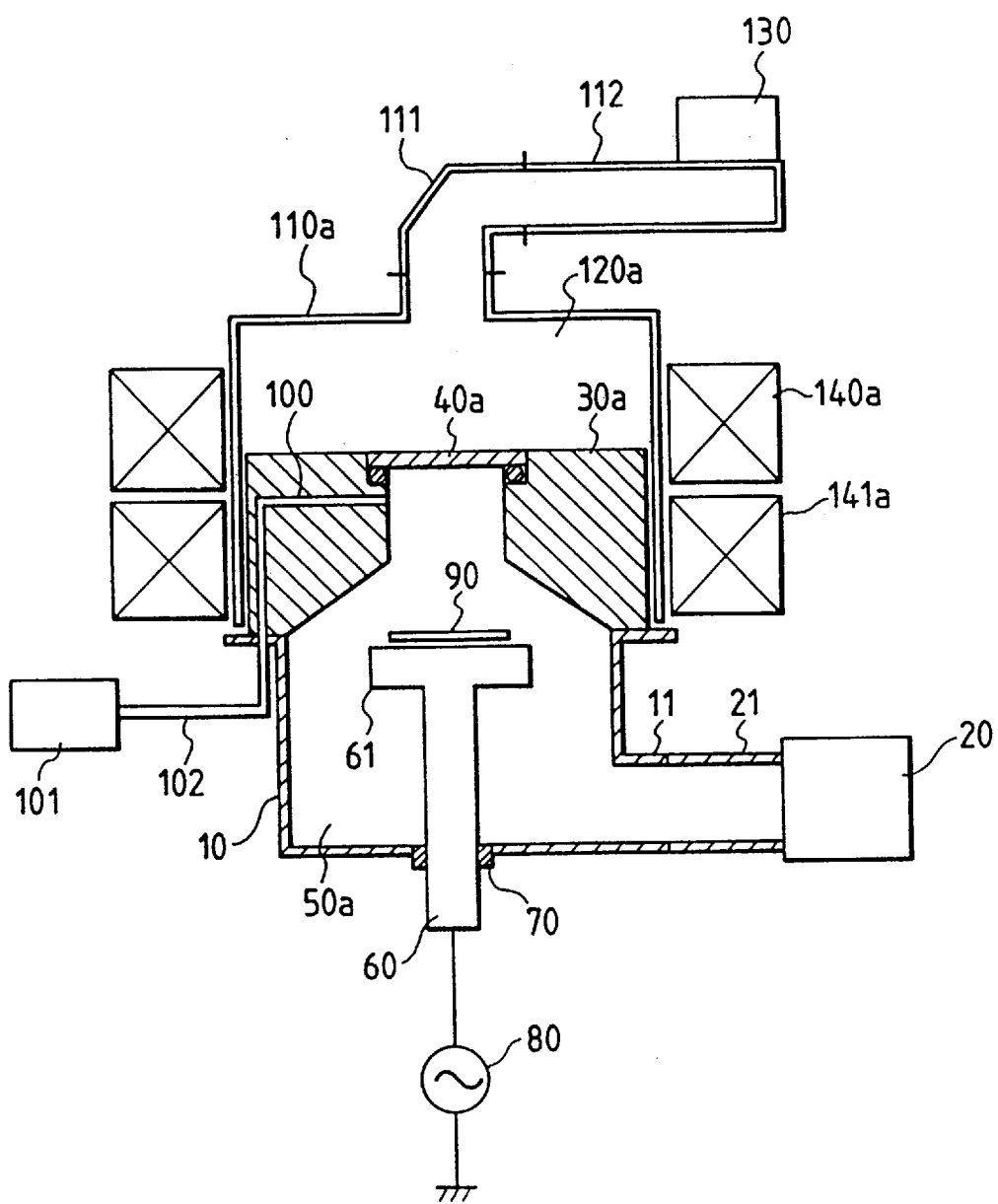
FIG. 1 is a vertical sectional view of portions in a microwave plasma etching equipment in a first embodiment of the present invention.

FIG. 1 is a vertical sectional constructional view of portions of a microwave plasma etching equipment in the first embodiment of the present invention.

Referring to FIG. 1, a vacuum vessel 10 has a structure in which it is open at its top part. The vacuum vessel 10 is made of, for example, stainless steel. In this case, the shape of the open top part of the vacuum vessel 10 is substantially circular as seen in plan. An exhaust nozzle 11 is formed at the bottom part of the side wall of the vacuum vessel 10. A vacuum pump unit 20 is disposed outside the vacuum vessel 10. The exhaust nozzle 11 and the intake port of the vacuum pump unit 20 are connected by an exhaust pipe 21. The exhaust pipe 21 is furnished with a switching valve (not shown), an exhaust resistance varying valve (not shown), etc.

In FIG. 1, an electric discharge block 30a is means (structure) having a plasma generation region therein. The electric discharge block 30a is in the shape of a hollow cylinder whose cross-sectional area does not change in the traveling direction of microwaves. It is made of a microwave non-transmitting material, herein, a nonmagnetic electric conductor such as aluminum. The outward dimension of the electric discharge block 30a is larger than the dimension of the open top part of the vacuum vessel 10. The electric discharge block 30a is gastightly mounted on the top wall of the vacuum vessel 10 in such a manner that the inner hollow thereof has an axis being substantially a vertical axis and is held in communication with the interior of the vacuum vessel 10 through the open top part of this vacuum vessel. A microwave transmitting window 40a is provided at the top part of the electric discharge block 30a while gastightly sealing the upper end part of the inner hollow of this block. The microwave transmitting window 40a is made of a microwave transmitting material such as quartz or alumina. Thus, a space 50a shut off from the exterior of the equipment is defined by the interior of the vacuum vessel 10, the inner hollow of the electric discharge block 30a and the microwave transmitting window 40a.

As shown in FIG. 1, a sample holder shaft 60 is gastightly attached to the bottom wall of the vacuum vessel 10 in a state in which the upper part thereof is plunged into the space 50a, while the lower part thereof is protruded out of the vacuum vessel 10. The bottom wall of the vacuum vessel 10 and the sample holder shaft 60 are electrically insulated by an electric insulator member 70. The axis of the sample holder shaft 60 is substantially a vertical axis. A sample holder 61 has its one surface, herein, its upper surface, formed as a sample setting surface. The sample holder 61 is mounted on the upper end of the sample holder shaft 60 in such a manner that the sample setting surface is held substantially horizontal. Of course, the sample holder shaft 60 and the sample holder 61 may well be unitarily formed. In this case, an RF power source 80 which is a biasing power source is disposed outside the space 50a. The sample holder shaft 60 is connected to the RF power source 80. The sample holder shaft 60 as well as the sample holder 61 is made of an electric conductor, and the sample holder 61 is electrically conductive with the sample holder shaft 60. On the other hand, the vacuum vessel 10 is grounded, and herein, also the electric discharge block 30a is grounded through the vacuum vessel 10. Incidentally, any of a DC power source, etc., can be alternatively used as the biasing power source. Besides, in the illustrated case, a coolant channel (not shown) is formed in the sample holder 61, and a coolant feed passage (not shown) and a coolant discharge passage (not shown) which communicate with the coolant channel are respectively formed in the sample holder shaft 60. A coolant feeder (not shown) is disposed outside the space 50a. The coolant feed port of the coolant feeder and the coolant feed passage of the sample holder shaft 60 are connected by a coolant feed pipe (not shown). One end of a coolant discharge pipe (not shown) is connected to the coolant discharge passage of the sample holder shaft 60, while the other end thereof is connected to a coolant recovery tank (not shown) or is let open to the atmospheric air.

In the case of FIG. 1, the microwave transmitting window 40a and the sample setting surface of the sample holder 61, or the surface to-be-processed of a sample, such as semiconductor device substrate 90, set on the sample setting surface, oppose each other in the vertical direction, and the planes thereof are substantially parallel to each other. By the way, the constituent members should desirably be so arranged that the inner hollow of the electric discharge block 30a, the microwave transmitting window 40a, and the sample setting surface of the sample holder 61, or the surface to-be-processed of a sample 90, are substantially concentric to one another. Besides, in the illustrated case, the inner hollow of the electric discharge block 30a has a shape in which it is taperingly flared from its intermediate part to its lower end part in the height direction of the electric discharge block 30a. This shape results from the fact that the cross-sectional area of the upper part of the inner hollow of the electric discharge block 30a is smaller than the area of the surface to-be-processed of the sample 90. Incidentally, in a case where the inner hollow of the electric discharge block 30a has a cross-sectional area larger than the area of the surface to-be-processed of the sample 90, it need not have the taperingly-flared shape as stated above, but it may well have a cross section which is substantially identical from its upper end part to its lower end part in the height direction of the electric discharge block 30a.

As shown in FIG. 1, a gas feed passage 100 is formed within the electric discharge block 30a. A processing gas source 101 is disposed outside the space 50a. The processing gas source 101 and one end of the gas feed passage 100 are connected by a gas feed pipe 102. The gas feed pipe 102 is furnished with a switching valve (not shown), a gas flow rate controller (not shown), etc. The other end of the gas feed passage 100 is let open to the inner hollow of the electric discharge block 30a at the position between the upper end part and intermediate part of this inner hollow in the height direction of the electric discharge block 30a.

In the case of FIG. 1, a waveguide 110a is disposed outside the electric discharge block 30a in a state in which it embraces the block 30a therein. The waveguide 110a terminates at the vacuum vessel 10. Herein, the waveguide 110a is substantially in the shape of a cylinder. A space 120a having a predetermined height (interval) is formed between the top wall of the waveguide 110a, being the closed end wall thereof, and the upper end surface of the electric discharge block 30a (the upper surface of the microwave transmitting window 40a). In the illustrated case, an opening is formed in the part of the top wall of the waveguide 110a which confronts the upper surface of the microwave transmitting window 40a. Incidentally, the opening need not be always provided at the above position. A magnetron 130, which is a means for oscillating microwaves, is disposed outside the spaces 50a and 120a. The magnetron 130 and the waveguide 110a are connected by waveguides 111 and 112. The interiors of the waveguides 111 and 112 are held in communication with the space 120a, through the opening of the top wall of the waveguide 110a. Here, the waveguide 111 is a waveguide for rectangular/circular-mode orthogonal transformation, and the waveguide 112 is a rectangular waveguide. By the way, the magnetron 130 and the waveguide 110a may well be connected by any other microwave propagation means, for example, a coaxial cable.

As seen from FIG. 1, air-core coils 140a and 141a, which are means for generating a magnetic field, are annularly mounted on the outer periphery of the side wall of the waveguide 110a in the height direction, so as to form two stages herein. Further, in the illustrated case, the air-core coils 140a and 141a are substantially held in correspondence with the space 120a and with the outer-peripheral side surface of the electric discharge block 30a, respectively. They are respectively connected to a power source (not shown) through ON-OFF means (not shown), conduction current regulation means (not shown), etc.

In the construction of FIG. 1, the space 50a is evacuated for pressure reduction by opening the switching valve as well as the exhaust resistance varying valve and actuating the vacuum pump unit 20. In addition, a predetermined etching gas is introduced at a predetermined flow rate from the processing gas source 101 into the inner hollow of the electric discharge block 30a, through the gas feed pipe 102 and the gas feed passage 100 furnished with the switching valve, gas flow rate controller, etc. That is, the etching gas in introduced into the space 50a. Part of the etching gas introduced into the space 50a is exhausted by the vacuum pump unit 20 through the regulation of the valve opening degree of the exhaust resistance varying valve, whereby the pressure of the space 50a is regulated to an etching process pressure as predetermined.

Besides, in the construction of FIG. 1, the sample 90, one sample in this case, is carried into the vacuum vessel 10 by known transportation means (not shown). The sample 90 carried into the vacuum vessel 10 is delivered from the transportation means to the sample holder 61. The transportation means having delivered the sample 90 is withdrawn to a place where the processing of the sample 90 is not hampered. The sample 90, delivered to the sample holder 61, is set on the sample setting surface of this sample holder with its surface to-be-processed facing upwards. Also, the air-core coils 140a and 141a are energized, and a magnetic field is applied to the inner hollow of the electric discharge block 30a.

In the equipment of FIG. 1, the magnetron 130 is operated to oscillate the microwaves of, for example, 2.45 GHz. The oscillated microwaves are propagated through the waveguide 112 and are subjected to orthogonal transformation from the rectangular mode into the circular mode thereof by the waveguide 111, whereupon the resulting microwaves are guided to the waveguide 110a. Further, these microwaves are propagated into the electric discharge block 30a through the microwave transmitting window 40a only. The etching gas in the electric discharge block 30a is turned into plasma by the synergy between the magnetic field based on the air-core coils 140a, 141a and the electric field of the microwaves. Under the action of the intense magnetic field in the electric discharge block 30a, charged particles contained in the generated plasma are restrained from diffusing in directions orthogonal to the magnetic field, and they are rapidly diffused toward the interior of the vacuum vessel 10 having a weak magnetic field, thereby to cover the surface to-be-processed of the sample 90 set on the sample holder 61. Thus, the surface to-be-processed of the sample 90 is subjected to a predetermined etching process by the plasma. Further, on this occasion, an RF bias voltage is applied to the sample holder 61 by the RF power source 80, whereby positive ion species contained in the plasma are attracted toward the sample 90 and are caused to enter the surface of the sample to-be-processed, during the minus cycle times of the RF bias. Thus, ion etching can be effected. Besides, the coolant channel formed in the sample holder 61 is supplied with a predetermined coolant (such as cooling water or any other coolant at a temperature below 0° C.), from the coolant feeder and through the coolant feed pipe as well as the coolant feed passage. The coolant having flowed through the coolant channel is cycled to the coolant recovery tank, or discharged into the atmosphere, via a coolant discharge passage as well as a coolant discharge pipe. Thus, the temperature of the sample 90 is regulated to a predetermined value.

As described above, in this embodiment the electric discharge block made of the nonmagnetic electric conductor is disposed in the waveguide, so that the microwaves oscillated by the magnetron and propagated through the waveguide are introduced into the electric discharge block through only the microwave transmitting window of this electric discharge block. Therefore, as compared with those in the prior art construction wherein the microwaves are introduced also from the side surface of the electric discharge tube used, the uniformity of a plasma density distribution corresponding to the surface of he sample to be processed can be sharply enhanced, and the homogeneity of the processing of the surface of the sample to be processed can accordingly be enhanced.

Moreover, since the electric discharge block is made of the nonmagnetic electric conductor, the intensity and distributed state of the magnetic field which is generated by the air-core coils and which is applied to the inner hollow of the electric discharge block, namely, the plasma generation region, are not weakened and disturbed by the electric discharge block, and hence, the synergy between the microwave electric field and the magnetic field can proceed very efficiently. In consequence, lowering of the plasma density corresponding to the surface to-be-processed of the sample can be prevented, and lowering of the rate of the etching process of the surface to-be-processed of the sample can be prevented. In addition, since the electric discharge block is made of the nonmagnetic electric conductor, the intensity of the magnetic field which is applied to the plasma generation region is increased to a greater extent, and the synergy between the microwave electric field and the magnetic field can be intensified to a greater extent. In consequence, the plasma density corresponding to the surface to-be-processed of the sample can be increased to a greater extent, and the rate of the etching process of the surface to-be-processed of the sample can be enhanced more. By the way, in a microwave plasma etching equipment of the type having no magnetic field, wherein only the microwave electric field is utilized for plasma generation without employing the magnetic field, the electric discharge block need not be made of the nonmagnetic electric conductor as in this embodiment, but it may be satisfactorily made of an electric conductor.

Besides, since the inner hollow of the electric discharge block is in the taperingly-flared shape, lateral diffusion of the plasma proceeds with ease, and plasma having a larger area to that extent is generated, so that the inner outer peripheral parts of the surface to-be-processed of a sample of large diameter can be homogeneously etched.

Furthermore, not only can the homogeneity of the etching process within the surface to-be-processed of the sample be enhanced, but also the rate of the etching process can be raised owing to the ion etching performed by application of a voltage.

Incidentally, a distance from the surface of the sample to be processed, placed on the sample setting surface of the sample holder, to the inner surface of the microwave transmitting window, should desirably be set at, at least, ½ of a guide wavelength in the inner hollow of the electric discharge block, in order to further stabilize an electric discharge state in the inner hollow. Thus, the homogeneity of the etching process within the surface to-be-processed of the sample can be enhanced more stably.

Next, examples of the etching process of a silicon oxide film, as a sample to be etched, will be explained. The silicon oxide film was stacked on a silicon film.

In this case, a mixed gas consisting of $C_4F_8$, $CH_3F$ and $SF_6$ was employed as an etching gas. The silicon oxide film was etched under the conditions of the ratio of etching-gas flow rates: $C_4F_8/(C_4F_8+CH_3F)=0.36$, the processing pressure of the etching: 5 mTorr, and the temperature of the sample holder: 20° C., while the added quantity of $SF_6$ $\{C_4F_8/(C_4F_8+CH_3F)\}$ was changed within a range of 0–0.3. Then, an etching rate $A_1$, a selection ratio $B_1$, and uniformity $C_1$ within a surface to-be-etched were as shown in FIGS. 2 and 3.

Figure 2:
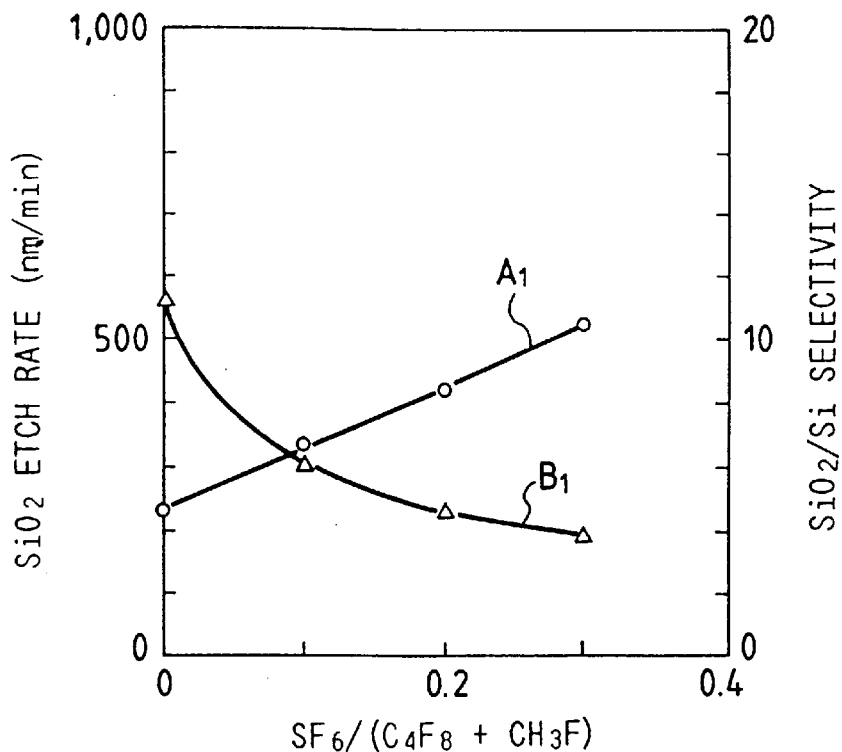
FIGS. 2 to 9 are graphs for explaining examples of etching processes of silicon oxide films.
Figure 3:
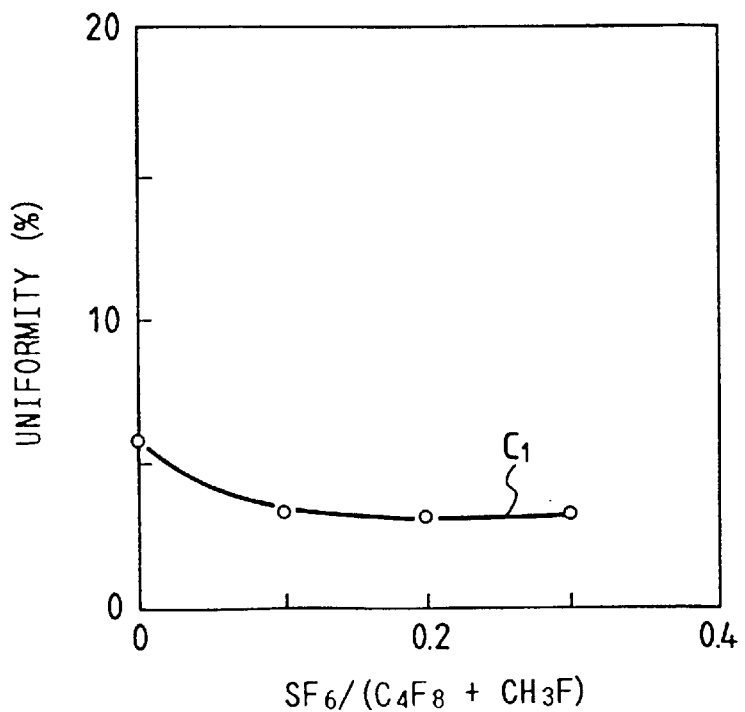

It is seen from FIGS. 2 and 3 that, when the gas $SF_6$ is included in the etching gas, the etching rate $A_1$ and the uniformity $C_1$ within the surface to-be-etched are both enhanced, as compared with those in the case where it is not mixed.

Figure 4:
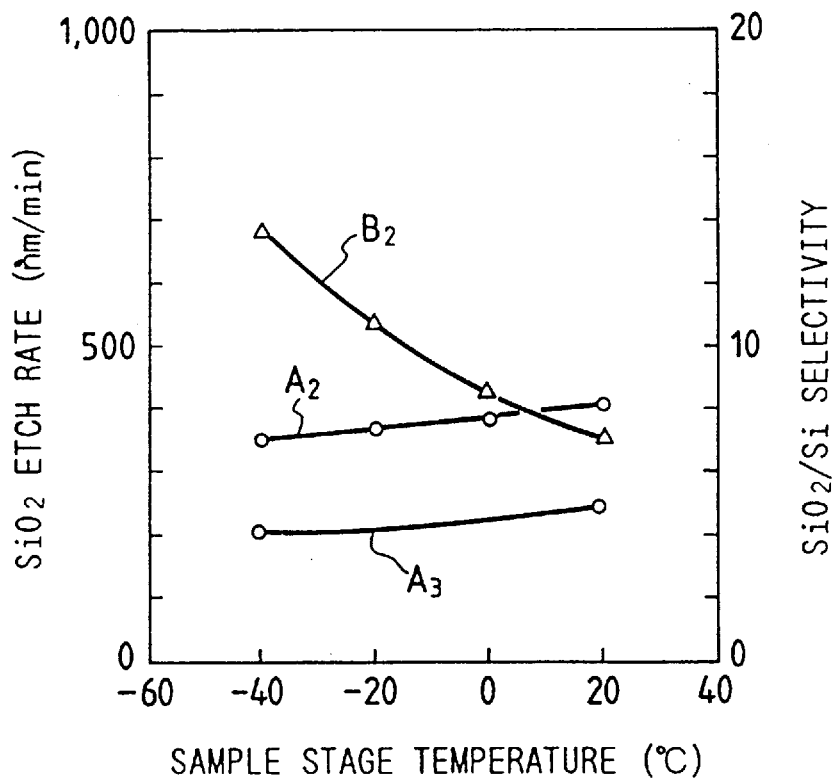
Figure 5:
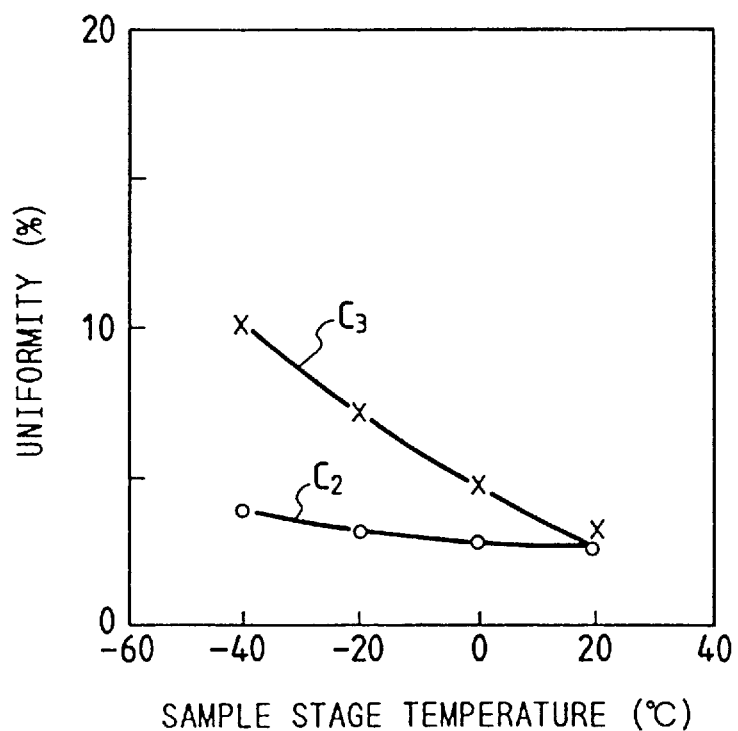

In addition, FIGS. 4 and 5 show an etching rate $A_2$, a selection ratio $B_2$, and uniformity $C_2$ within a surface to-be-etched in the case where the silicon oxide film was etched under the conditions of the ratio of etching-gas flow rates: 0.6, the added quantity of $SF_6$: 0.3, and the processing pressure of the etching: 5 mTorr, while the temperature of the sample holder was changed within a range of 2020 C.–40° C. by a cooler.

As seen from FIG. 4, by lowering the sample holder temperature to or below 0° C., the selection ratio $B_2$ is improved and heightened even when the gas $SF_6$ is mixed in the etching gas, and it becomes nearly equal to the selection ratio $B_1$ in the case shown in FIG. 2 where the sample holder is not cooled and where the gas $SF_6$ is not mixed in the etching gas. Besides, as shown in FIGS. 4 and 5, the etching rate $A_2$ and the uniformity $C_2$ within the surface to-be-etched are enhanced as understood by comparing them with respective curves $A_3$ and $C_3$ in the case where the gas $SF_6$ is not mixed in the etching gas. That is, the etching rate and the uniformity within the surface to-be-etched can be improved while maintaining the same extent of selection ratio as in the case of employing a mixed gas consisting of $C_4F_8$ and $CH_3F$ as the etching gas.

Besides, the etching process of the silicon oxide film was performed under the conditions of a ratio of etching-gas flow rates: $\{C_3F_6/(C_3F_6+CH_3F)\}=0.6$, the added quantity of $SF_6$: $\{SF_6/(C_3F_6+CH_3F)\}=0.3$, and the processing pressure of the etching: 5 mTorr, while the temperature of the sample holder was changed within the range of 20° C.–40° C.

Figure 6:
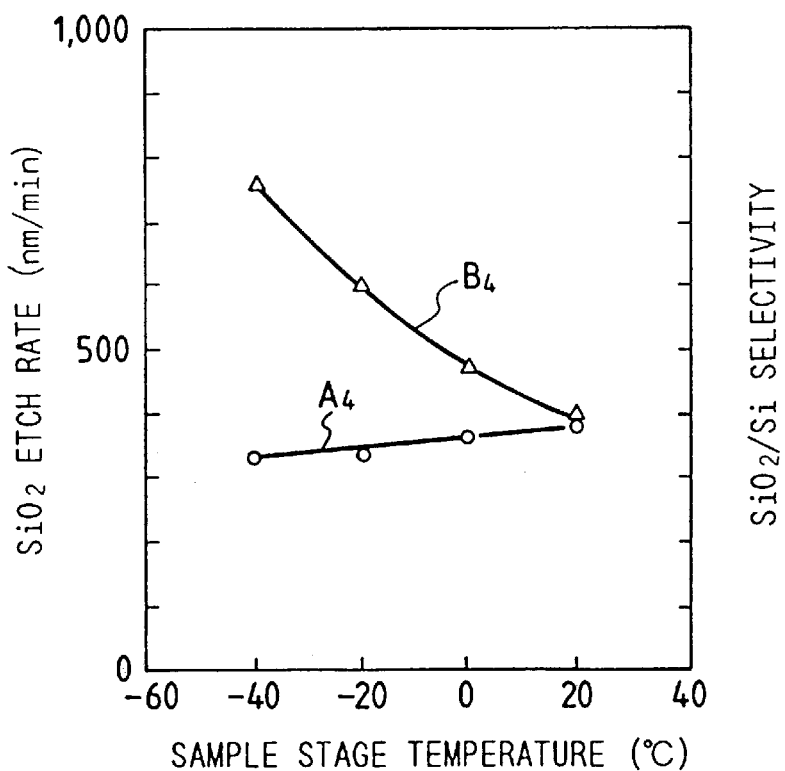
Figure 7:
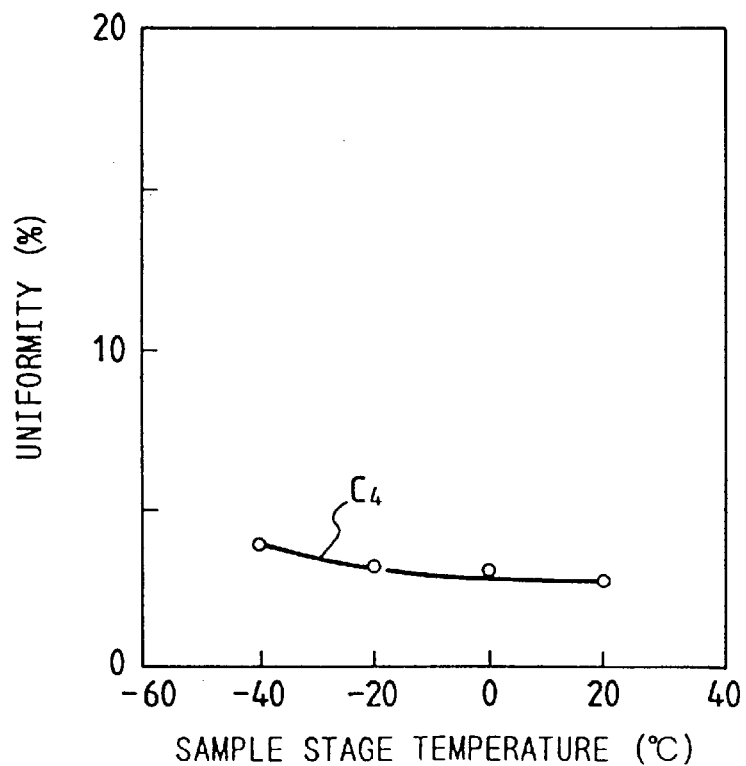

Curves in FIGS. 6 and 7 indicate, similarly to those in FIGS. 4 and 5, that the etching rate and the uniformity within the surface to-be-etched can be improved while maintaining the same extent of selection ratio as in the case of employing the mixed gas consisting of $C_4F_8$ and $CH_3F$ as the etching gas. Accordingly, even when the gas $C_4F_8$ is replaced with the gas $C_3F_6$ and the mixed gas consisting of $CH_3F$ and $SF_6$ is used, substantially equal effects can be attained.

Figure 8:
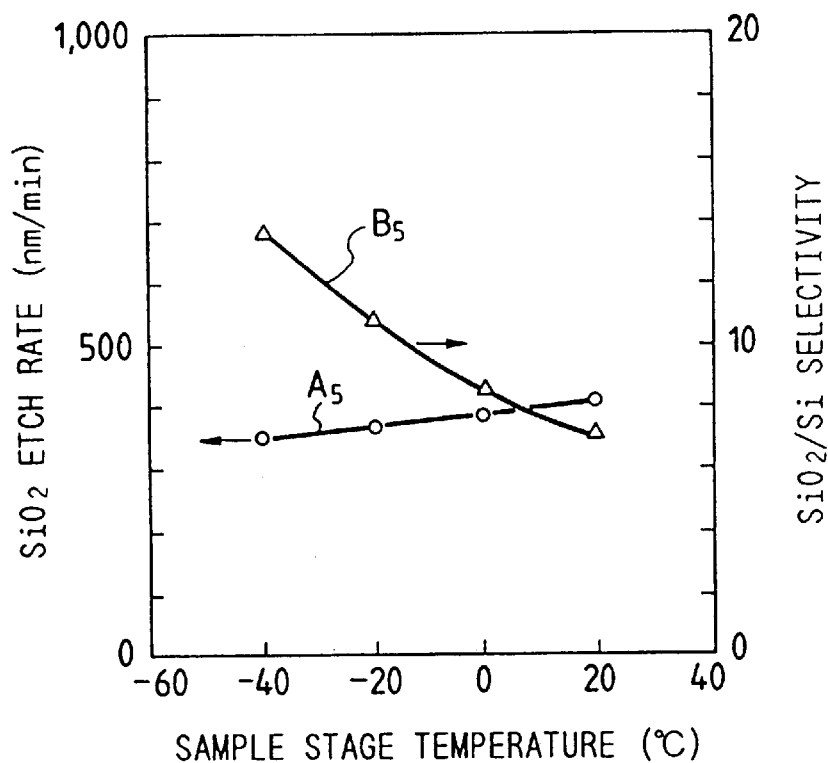
Figure 9:
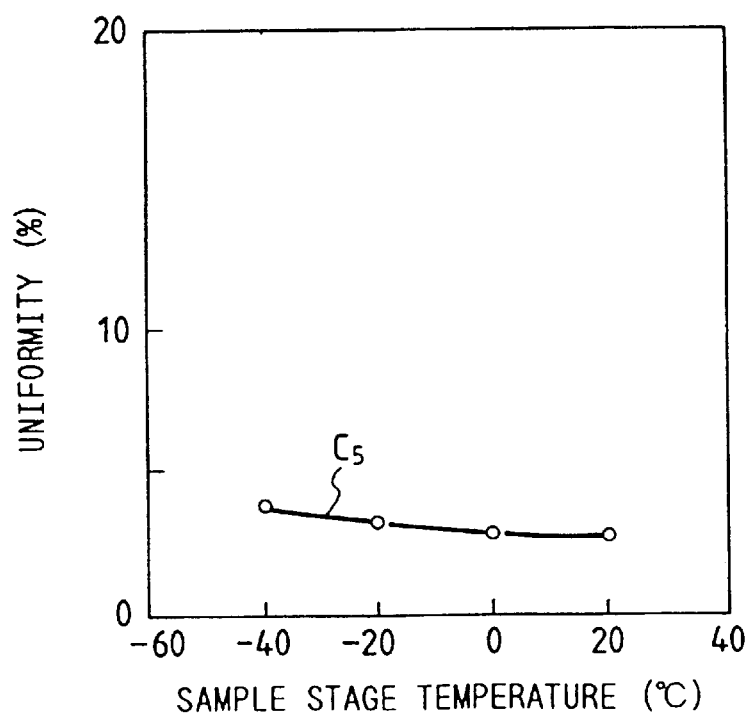

In addition, FIGS. 8 and 9 show the characteristics of an etching rate $A_5$, a selection ratio $B_5$, and uniformity $C_5$, of a surface to-be-etched, in the case where the silicon oxide film was etched by mixing $CH_4$ instead of the gas $CH_3F$ in the etching gas, exhibitive of the characteristics shown in FIGS. 4 and 5, and under the conditions of the ratio of etching-gas flow rates: $\{C_4F_8/(C_4F_8+CH_4)\}=0.35$, the added quantity of $SF_6$: $\{SF_6/(C_4F_8+CH_4)\}=0.3$, and the processing pressure of the etching: 5 mTorr, while the temperature of the sample holder was changed within the range of 20° C.–40° C.

As seen from FIGS. 8 and 9, even when this etching gas is used, characteristics similar to those in the foregoing cases shown in FIG. 4 and FIG. 6 can be obtained. That is, the etching rate and the uniformity within the surface to-be-etched can be enhanced while maintaining the selection ratio before the mixing of the gas $SF_6$.

Further, substantially the same effects can be attained even when other fluorocarbon gases denoted by $C_xF_y$, such as $C_2F_6$, $C_3F_8$ and $C_5F_{10}$, are used instead of the gas $C_4F_8$ or $C_3F_6$.

Next, there will be explained examples of the detection of an etching end point in the case of the etching process of the silicon oxide film of a sample. Incidentally, a fluorocarbon gas was employed as an etching gas.

As a technique for detecting the etching end point of a silicon oxide film which is subjected to an etching process by the use of a gaseous plasma of a fluorocarbon gas, there has been known, for example, one as disclosed in Japanese Patent Publication No. 52421/1982, wherein light emission of carbon monoxide contained in the plasma is monitored, and the point of time at which the light emission has decreased is detected, thereby to detect the etching end point of the silicon oxide film in this case.

The prior art technique is intended to detect the etching end point of the silicon oxide film which is subjected to an etching process by reactive sputter etching. This technique does not take into consideration at all detection of the etching end point of the silicon oxide film which is subjected to the etching process by employing a plasma of a fluorocarbon gas generated by interaction between a microwave electric field and a magnetic field under a reduced pressure.

More specifically, an experiment conducted by the inventors of the present invention has revealed that, in the case of the etching process of the silicon oxide film by such microwave plasma etching of the type having the magnetic field, which differs from the reactive sputter etching, the end point of the etching cannot be detected even when the light emission of carbon monoxide is selected of course, the etching end point cannot be detected even in case of the etching process of the silicon oxide film by the microwave plasma etching of the type having the magnetic field in which the flow rate of the fluorocarbon gas is changed or in which two or more kinds of fluorocarbon gases are used with the flow rate ratio thereof changed.

The first example of the detection of the etching end point will be explained with reference to FIG. 10.

Figure 10:
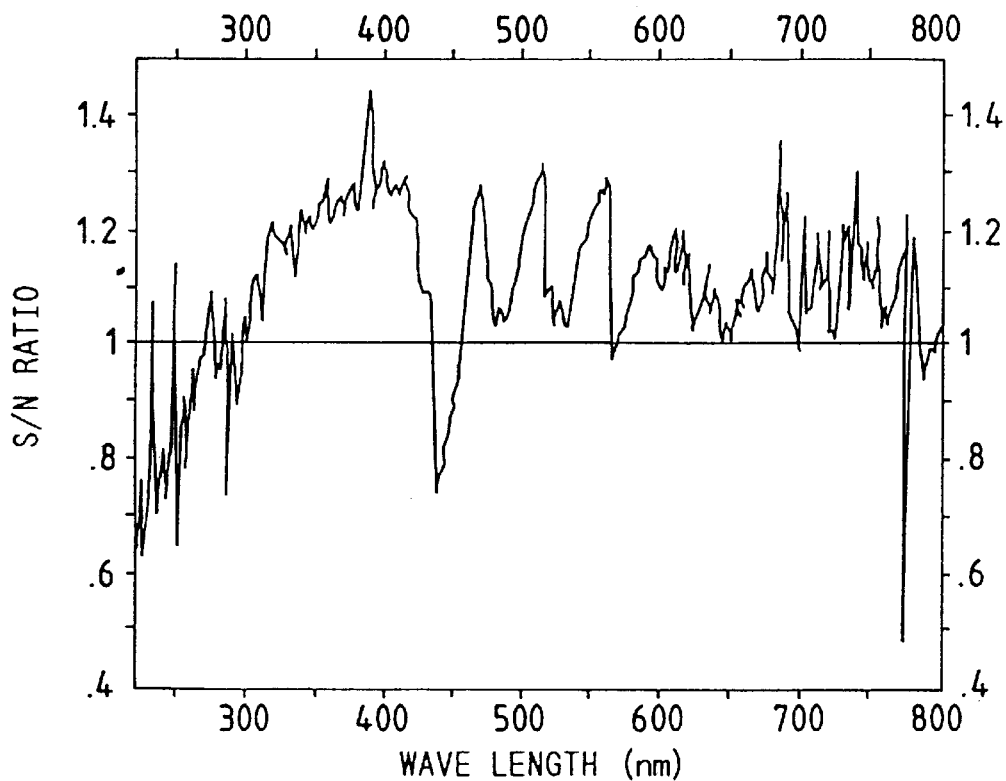
FIGS. 10 to 12 are graphs for explaining examples of detection of the etching end points of silicon oxide films.

FIG. 10 shows the S/N (signal-to-noise) ratios of various wavelengths during the etching of the silicon oxide film, and at the end thereof, in the case where the silicon oxide film was subjected to an etching process by employing a mixed gas consisting of $C_4F_8$ and $CH_2F_2$ as the fluorocarbon gas. Herein, the mixed gas was introduced into the electric discharge region (not shown), of the microwave plasma etching equipment of the type having a magnetic field, at flow rates of 25 sccm for the $C_4F_8$ gas and 15 sccm for the $CH_2F_2$ gas. The mixed gas in the electric discharge region was turned into plasma under a reduced pressure of about 5 mTorr by the interaction between a microwave electric field at 2.45 GHz and a magnetic field of 875 gauss. The silicon oxide film was etched using the plasma.

Referring to FIG. 10, the S/N ratio width values of the light emissions of carbon molecules, oxygen atoms and fluorine atoms in the light emission of the plasma are larger as compared with that of the light emission of carbon monoxide having heretofore been utilized. Particularly in FIG. 10, the S/N ratios at the wavelength of the carbon molecules (388.9 nm, 469.8 nm, 471.5 nm, 473.7 nm, 512.9 nm, 516.5 nm, 558.6 nm and 563.5 nm) are about 1.5, that is, the S/N ratio width value becomes about 0.5; the S/N ratios at the wavelengths of the oxygen atoms (777.1 nm, 777.4 nm and 777.5 nm) are about 0.3, that is, the S/N ratio width value becomes about 0.7; and the S/N ratio at the wavelength of the fluorine atoms (685.6 nm) is about 1.6, that is, the S/N ratio width value becomes about 0.6. In this manner, values larger than the S/N ratio width value 0.1 (S/N ratio=1.1) at the wavelength of carbon monoxide (519.6 nm) have been obtained.

The light emission having such a large S/N ratio width value is separated and selected by means (not shown) for spectrally selecting the light emission from within the plasma. The emission intensity of the selected light emission has its variation with time monitored by monitor means (not shown), and the etching end point of the silicon oxide film is detected by detection means (not shown). By way of example, a function of the emission intensity of the selected light emission and the time period of the etching process of the silicon oxide film is quadratically differentiated, and the etching end point of the silicon oxide film is detected when the value of the quadratic differentiation has reached an end-point decision value. Since, in this case, the S/N ratio width value is large, the quadratic differentiation value becomes large, and the etching end point of the silicon oxide film can be detected at high accuracy.

Incidentally, results similar to those in FIG. 10 are obtained even in a case where the mixed gas is turned into plasma as stated above under a pressure reduced down to about 50 mtorr and where a silicon oxide film is subjected to an etching process by the use of the plasma.

In addition, although the mixed gas consisting of $C_4F_8$, and $CH_2F_2$ is employed in this case, similar results are obtained even when one kind of fluorocarbon gas, or example, $C_4F_3$ is used without employing the two kinds of fluorocarbon gases in the above manner.

Besides, in FIG. 10, the S/N ratio of the light emission of SiF (436.8 nm) is about 0.75, that is, the S/N ratio width value is 0.25. Even with this light emission, the end point of etching can be favorably detected.

The second example of the detection of the etching end point will be explained with reference to FIG. 11.

Figure 11:
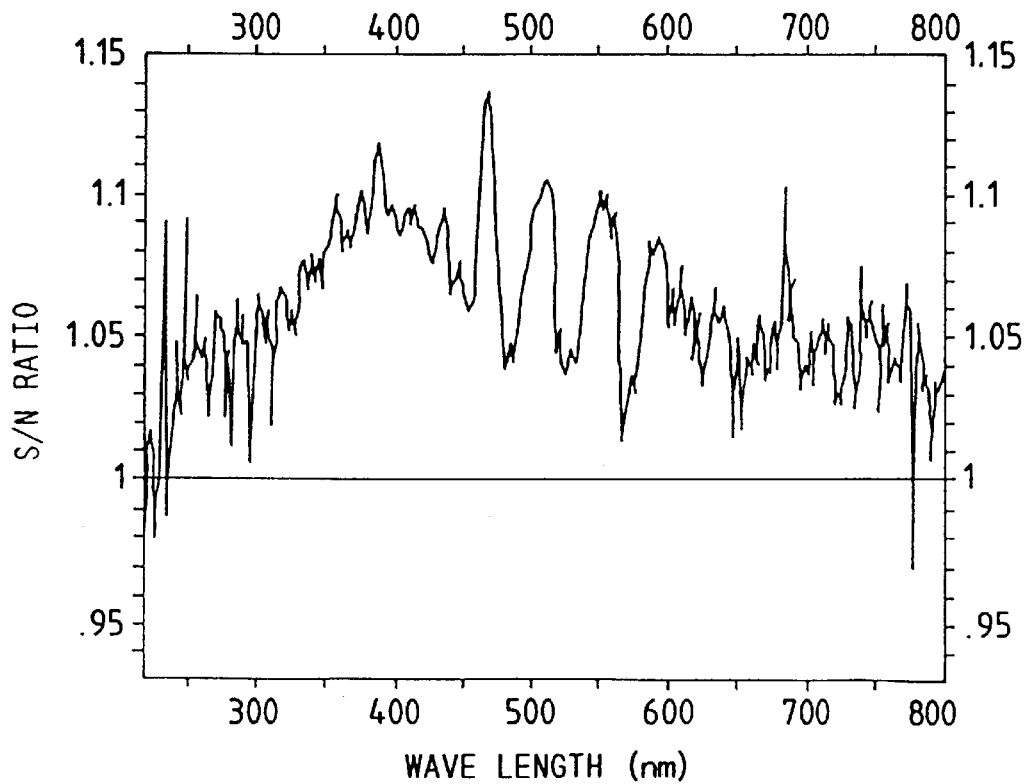

In the case of FIG. 11, the flow rates of the components of the etching gas are 50 sccm for $C_4F_8$ and 30 sccm for $CH_2F_2$, and the other conditions are the same as those of he first example described before. Regarding the flow rates, the ratio of the flow rates of the gases $C_4F_8$ and $CH_2F_2$ remains unchanged, but the gas flow rates are changed. Such a measure is taken, for example, in a case where the selection ratio of etching (the selection ratio between the silicon oxide film and a silicon film being a subbing film) is to be changed.

Referring to FIG. 11, also in this case, the S/N ratio width values of the light emissions of carbon molecules, oxygen atoms and fluorine atoms in the light emission of the plasma are larger as compared with that of the light emission of carbon monoxide.

Important in the comparison of FIG. 11 with FIG. 10 is that the reversal phenomena of the S/N ratios of these light emissions do not arise due to the change of the gas flow rates. This signifies that the etching end point can be detected stably and accurately in the case of, for example, the etching process of the silicon oxide film based on the changed and enhanced selection ratio. Here, the reversal phenomenon of the S/N ratio is a phenomenon in which the S/N ratio is reversed above and below with respect to the S/N ratio=1.0. At the S/N ratio=1.0, the quadratic differentiation value becomes zero, so that the etching end point fails to be detected. By way of example, the S/N ratio of the light emission of the compound SiF at the wavelength of 436.8 nm exhibits a value below 1.0 in FIG. 10, but it exhibits a value above 1.0 in FIG. 11. With such light emission of the compound SiF, accordingly, the S/N ratio sometimes exhibits 1.0 due to the change of the gas flow rates, and the etching end point cannot be detected stably and accurately in the case of, For example, the etching process of the silicon oxide film based on the changed and enhanced selection ratio.

A third example of the detection of the etching end point will be explained with reference to FIG. 12.

Figure 12:
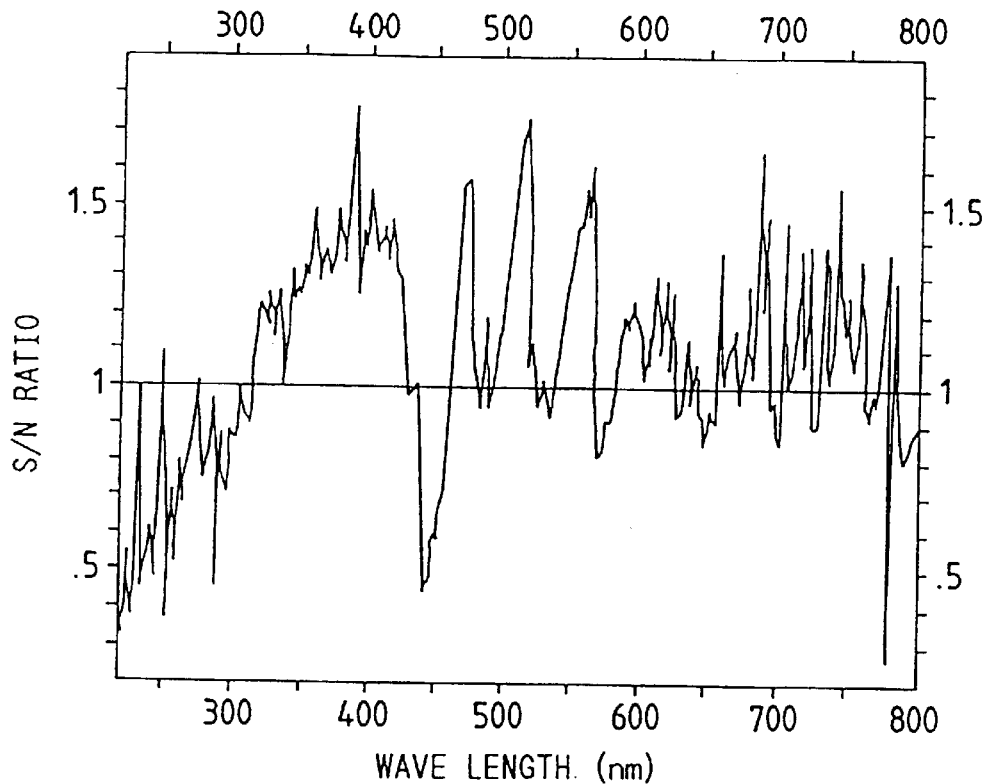

In the case of FIG. 12, the flow rates of the components of the etching gas are 10 sccm for $C_4F_8$ and 15 sccm for $CH_2F_2$, and the other conditions are the same as those in FIG. 10. That is, when the conditions of both the examples are compared, the ratio of the flow rates of the gases $C_4F_8$ and $CH_2F_2$ is changed. Such a measure, namely, changing the ratio of the gas flow rates, is taken, for example, in case of controlling an etching profile in the etching process of the silicon oxide film.

Referring to FIG. 12, also in this case, the S/N ratio width values of the light emissions of carbon molecules, oxygen atoms and fluorine atoms in the light emission of the plasma are larger as compared with that of the light emission of carbon monoxide.

Important in the comparison of FIG. 12 with FIG. 10 is that the reversal phenomena of the S/N ratios of these light emissions do not arise even with the change of the gas flow rates. This signifies that the etching end point can be detected stably and accurately in the case of, for example, the etching process of the silicon oxide film based on the control of the etching profile.

Incidentally, by way of example, the S/N ratio of the light emission of carbon monoxide at the wavelength of 519.6 nm exhibits a value above 1.0 in FIG. 10, but it exhibits a value below 1.0 in FIG. 12. With such light emission of carbon monoxide, accordingly, the S/N ratio sometimes exhibits a value of 1.0 due to the chance of the gas flow rates, and the etching end point cannot be detected stably and accurately in the case of, for example, the etching process of the silicon oxide film based on the control of the etching profile.

Although the gases $C_4F_8$ and $CH_2F_2$ are employed as the fluorocarbon gases in the above examples of the detection of the etching end point, other fluorocarbon gases such as $C_2F_6$, $C_3F_6$, $C_3F_8$ and $CH_3F$ are also employed.

A second embodiment of the present invention will be described with reference to FIGS. 13–16.

Figure 13:
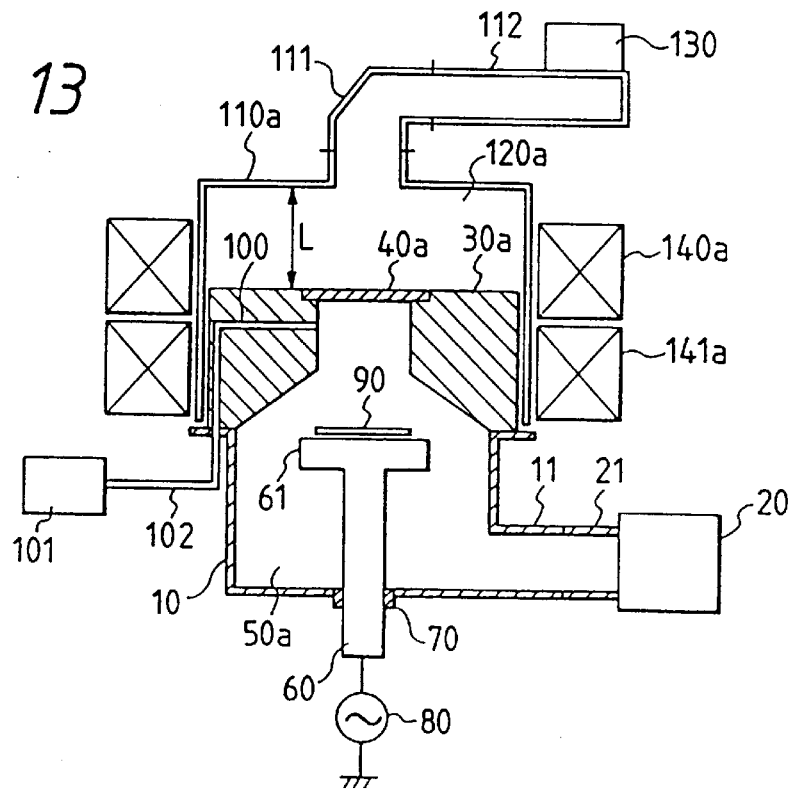
FIG. 13 is a vertical sectional view of portions of microwave plasma etching equipment in a second embodiment of the present invention.

FIG. 13 is a vertical sectional constructional view of portions of a microwave plasma etching equipment in the second embodiment of the present invention.

Referring to FIG. 13, in this case, the equipment is so constructed as to be capable of regulating the interval L between the top surface of an electric discharge block 30a and the inner surface of the top wall of a waveguide 110a. In, for example, assembling the equipment or operating the equipment, the interval L is regulated in such a way that the waveguide 110a or the electric discharge block 30a is moved in the vertical direction by means (not shown) for the vertical movement thereof. In FIG. 13, the same components and units as in FIG. 1 are indicated by the same symbols, and they shall be omitted from the description.

Figure 14:
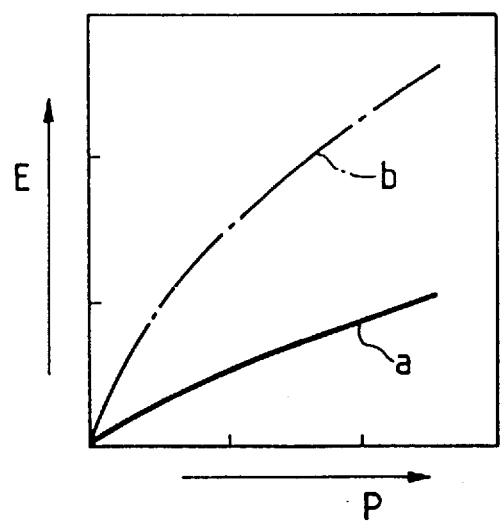
FIG. 14 is a model diagram showing relationships between the output power of a power source and the output voltage while comparing the second embodiment of the present invention with the prior art.

In the case of FIG. 13, the interval L is regulated in conformity with the shape of the space 120a, that is, the shape in which the space is enlarged at the part of the waveguide 110a connected with the waveguide 111 and is thereafter reduced at the part thereof corresponding to the microwave transmitting window 40a. Thus, the impedance matching of microwaves is possible, and the reflected waves of the microwaves from a load such as plasma can be made null. As shown in FIG. 14, a plasma density on this occasion is considered to rise several times as compared with that in the case of a prior-art technique employing a semispherical discharge tube. The reason therefor is that, since the reflected waves of the microwaves can be made null, the microwaves come to be efficiently absorbed by the plasma.

FIG. 14 shows the relationships between the output power (P) and output voltage (E) of the Dower source in this embodiment (a) and the prior-art technique (b), as have been obtained in an experiment in which, in order to simply compare the values of the plasma densities, an RF voltage of constant power characteristic was applied to the sample holder 61, and the output voltage at that time was read. FIG. 14 indicates that, as the output voltage (E) is lower, a lower discharge impedance, namely, a higher plasma density, is attained.

In this embodiment, accordingly, the following effects are brought forth in addition to the effects in the first embodiment:

(1) Since the plasma density is high, the etching process rate can be sharply enhanced.

(2) Since the plasma density is high, the acceleration energy of ions toward the sample can be suppressed low, and an etching process of light damage can be realized.

By the way, the interval L between the top surface of the electric discharge block 30a and the inner surface of the top wall of the waveguide 110a should desirably be regulated depending upon the conditions of an etching process such as the kind of an etching gas and the pressure of the etching process. It is also allowed, however, that the interval L is previously set by a preliminary experiment, etc., and that the equipment is designed and fabricated with the preset interval L.

Next, a first example of an apparatus setup for regulating the interval L between the top surface of the electric discharge block and the inner surface of the too wall of the waveguide will be described with reference to FIG. 15.

Figure 15:
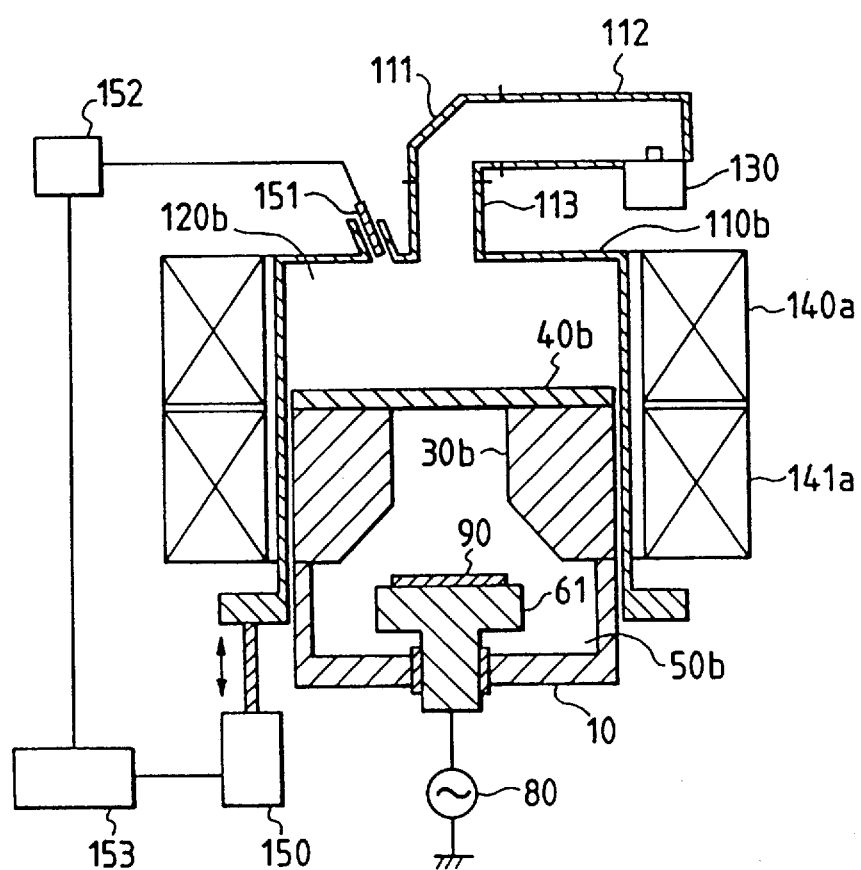
FIGS. 15 and 16 are vertical sectional views of portions of microwave plasma etching equipment, each showing a practicable example of a setup for regulating the interval between the top surface of an electric discharge block and the inner surface of the top wall of a waveguide.

As shown in FIG. 15, a waveguide 110b is formed of a cylinder having an inner diameter larger than each of the inner diameter of a waveguide 113 and the inner diameter of the microwave inlet of an electric discharge block 30b. The waveguide 110b has a cross-sectional structure in which its canter axis is surrounded with a U-shaped conductor wall. That is, it has a structure similar to that of an EH tuner in a rectangular waveguide. As readily understood, the shape of the cylinder can fulfill the function of a microwave matching unit.

In the setup of FIG. 15, a hydraulic cylinder 150 installed at a lower part of the equipment is driven, whereby the height between the top surface of the electric discharge block 30b and the inner surface of the top wall of the waveguide 110b is regulated to establish the matching. Further, light emission in the plasma generated within a space 50b is measured by a spectroscope 152 through an optical fiber 151, thereby to estimate a plasma density. Using the estimated plasma density, a controller 153 controls the matching in the waveguide 110b as stated above in order to generate high-density plasma.

In this case, the microwaves are matched according to the light emission in the plasma generated in the space 50b, whereby they can be efficiently supplied into the plasma generated in the space 50b. This brings forth the effect that the high-density plasma is generated to realize a high-speed plasma etching process.

In addition, a second example of an apparatus setup for regulating the interval L between the top surface of the electric discharge block and the inner surface of the top wall of the waveguide will be described with reference to FIG. 16.

Figure 16:
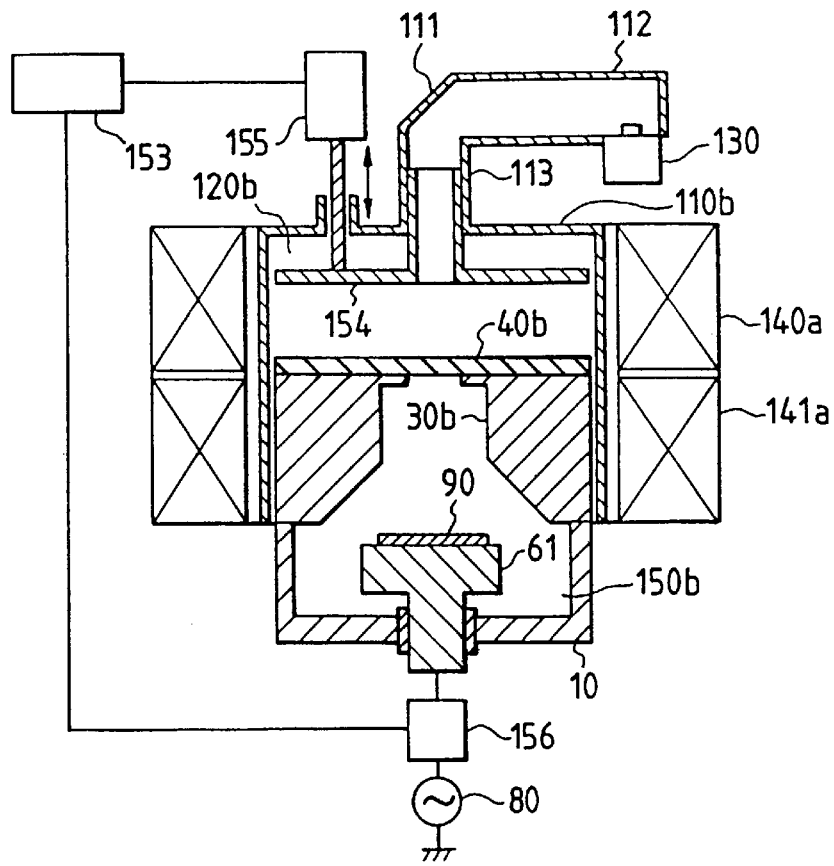

As shown in FIG. 16, a reflector plate 154 made of a conductor such as Al is disposed inside a waveguide 110b functioning as a microwave matching unit as stated above, and it is driven in the vertical direction by an air cylinder 155, whereby an effective height in the waveguide 110b is regulated to establish the matching. Besides, in this case, an RF voltage Vpp applied to a sample holder 61 is measured by an RF voltage measuring instrument 156, thereby to estimate a plasma density. Using the estimated plasma density, a controller 153 controls the matching in the waveguide 110b so as to generate high-density plasma.

Herein, in addition to the effect in FIG. 15, there is the effect that, since the matching is established by roving only the reflector plate 154, a small-sized driver such as the air cylinder 155 may well be used. Also, the setup in FIG. 16 has a structure in which the part of the electric discharge block 30*b* corresponding to a microwave inlet has a reduced inner diameter. This structure brings forth the effect that the inner diameter of the other part of the electric discharge block 30*b* can be enlarged, so a sample 90 of large diameter can be etched and processed more homogeneously.

In the above, as the plasma state, a quantity which changes depending upon an electron density, an electron temperature, an ion density, an ion temperature, a radical density, a radical temperature, etc., is measured by utilizing the light emission in the plasma in the example of FIG. 15, or by utilizing the RF voltage in the example of FIG. 16, and the matching in the waveguide 110*b* is regulated on the basis of the measured quantity so as to generate the high-density plasma. However, this embodiment need not be especially restricted to the examples in FIGS. 15 and 16. That is, this embodiment may be so constructed that the quantity which changes depending upon the aforementioned factors is measured as the plasma state and that the matching In the waveguide 110*b* is regulated on the basis of the measured quantity so as to generate the high-density plasma.

Figure 17:
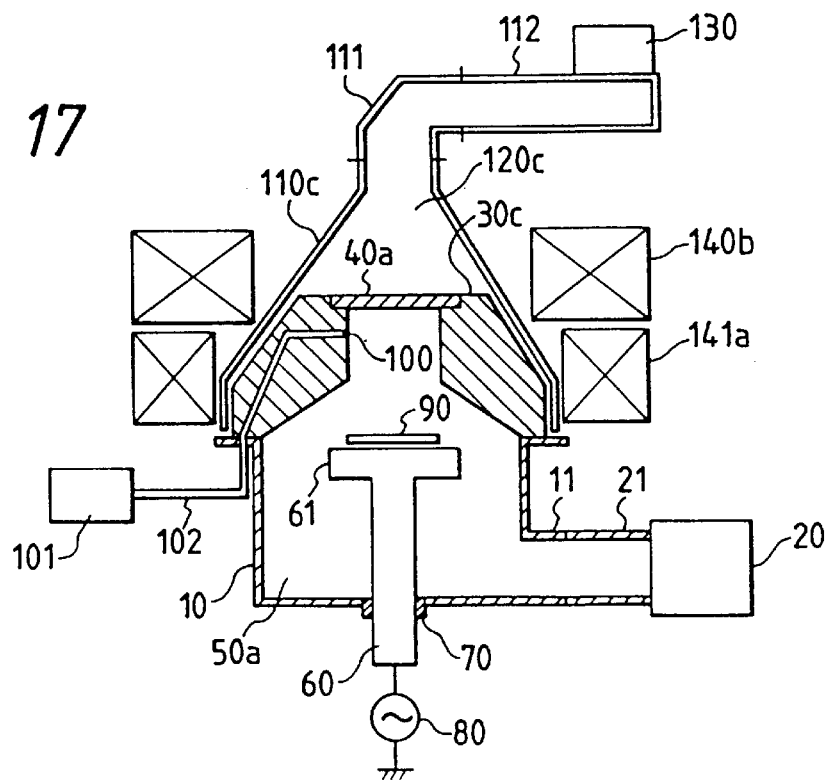
FIG. 17 is a vertical sectional view of portions of microwave plasma etching equipment in a third embodiment of the present invention.

FIG. 17 is a vertical sectional constructional view of portions of a microwave plasma etching equipment, in a third embodiment of the present invention.

In FIG. 17, the points of difference from FIG. 1 showing the first embodiment of the present invention are that a waveguide 110*c* is one which is flared taperingly, and that the outer-peripheral side surface of an electric discharge block 30*c* is tapered along the shape of the inner-peripheral surface of the waveguide 110*c* (but that the shape of the inner cylindrical part of the block 30*c* is the same as in FIG. 1). The waveguide 110*c* is in a shape in which it is taperingly flared from its end part connected with a waveguide 111, toward the electric discharge block 30*c*. In addition, an air-core coil 140*b* arranged at an upper stage is endowed with an inner diameter smaller than that of an air-core coil 141*a* arranged at a lower stage, thereby to increase the number of its turns. Thus, it is suited to the intensity distribution of a magnetic field which is applied to an electric discharge portion (the magnetic field is intense on a side from which microwaves are introduced, and it weakens gradually toward the side of a vacuum vessel 10). In FIG. 17, the same components and units as in FIG. 1 are indicated by the same symbols, and they shall be omitted from, the present description.

This embodiment brings forth the following effect in addition to the effects of the first embodiment:

(1) Since the shape of the waveguide including the electric discharge block therein is tapered, the number of turns of the air-core coil arranged at the upper stage can be increased, and a coil Dower source (not shown) for generating the maximum magnetic field can be made small in size.

The fourth embodiment of the present invention will be described with reference to FIG. 18.

Figure 18:
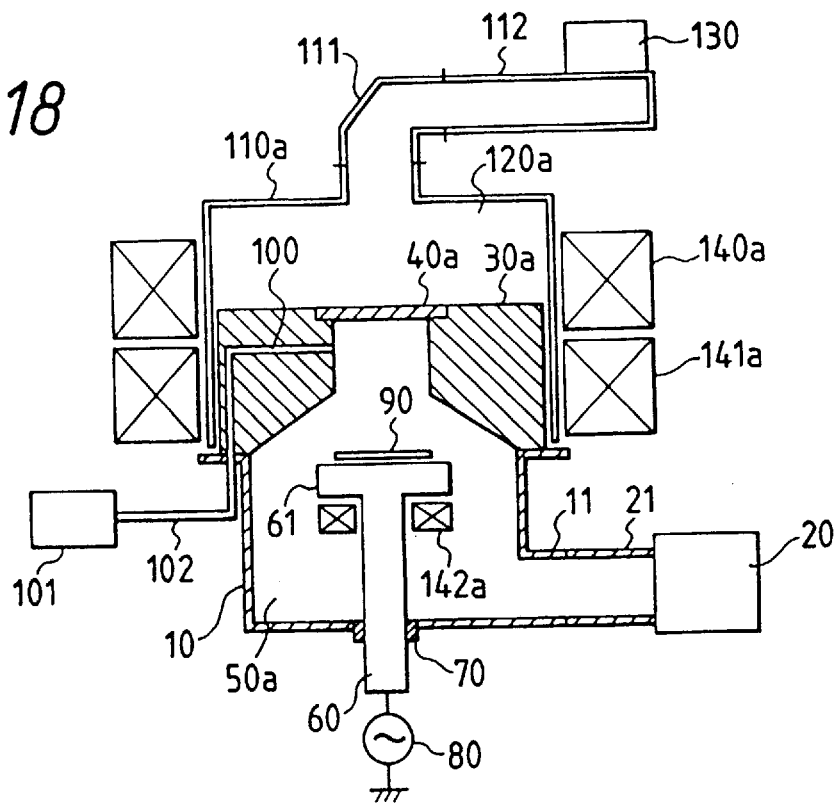
FIG. 18 is a vertical sectional view of portions of microwave plasma etching equipment in a fourth embodiment of the present invention.

FIG. 18 is a vertical sectional constructional view of portions of a microwave plasma etching equipment in the fourth embodiment of the present invention.

In FIG. 18, the point of difference from FIG. 1 showing the first embodiment of the present invention is that an air-core coil 142*a*, for applying a correcting magnetic field, is mounted round a sample holder shaft 60 on the side of a sample holder 61 remote from the sample setting surface thereof. The air-core coil 142*a* serves to correct that magnetic field in the vicinity of the surface to-be-processed of a sample 90 which is generated by air-core coils 140*a* and 141*a* for applying a magnetic field to the interior of an electric discharge block 30*a*. In FIG. 18, the other components and units as in FIG. 1 are indicated by the same symbols, and they shall be omitted from the present description.

In the embodiment of FIG. 18, in a state in which magnetic fluxes based on the air-core coils 140*a* and 141*a* extend downwards as viewed in the figure, the air-core coil 142*a* is operated as stated below. When the magnetic fluxes of the air-core coil 142*a* are directed upwards in the figure, the combined magnetic field in the vicinity of the surface to-be-processed of the sample 90 is directed toward the outer periphery of this surface to-be-processed of the sample 90. To the contrary, when the magnetic fluxes of the air-core coil 142*a* are directed downwards, the combined magnetic field is about to concentrate on the central part of the surface to-be-processed of the sample 90. Plasma to be generated has the property of easily diffusing in the flow direction of the magnetic fluxes. By regulating the direction and intensity of the correcting magnetic field, therefore, the density and diffusion slate of the plasma can be corrected, and the etching process rate and homogeneity of the etched sample can be corrected.

Figure 19:
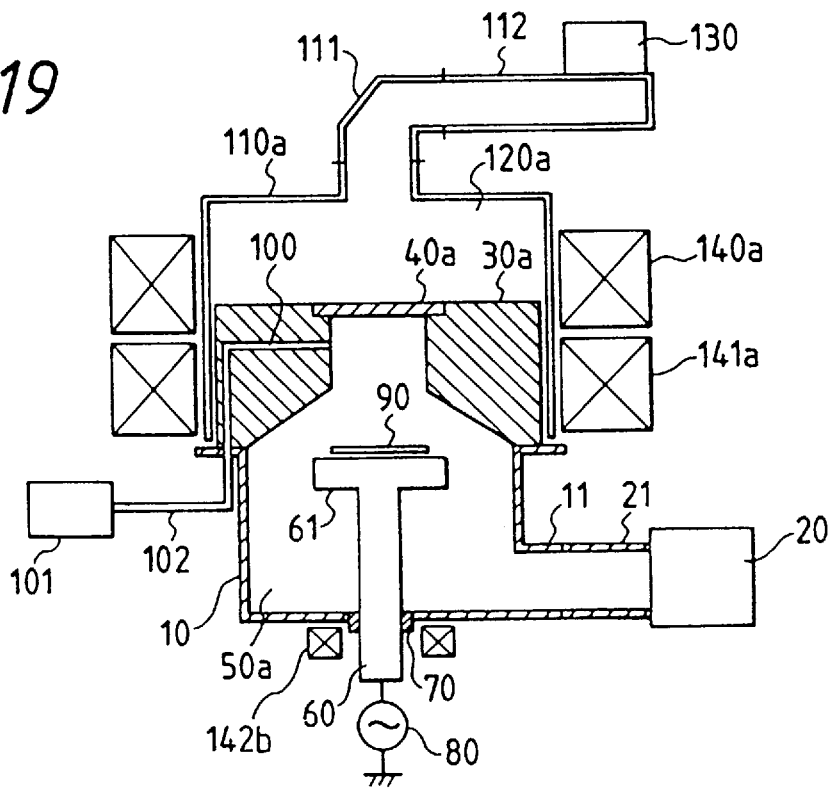
FIG. 19 is a vertical sectional view of portions of microwave plasma etching equipment in the fifth embodiment of the present invention.

The fifth embodiment of the present invention will be described with reference to FIG. 19. In FIG. 19, the same components and units as in FIG. 1 showing the first embodiment of the present invention,are indicated by the same symbols, and they shall be omitted from the present description.

In FIG. 19, symbol 142*b* denotes an air-core coil for applying a correcting magnetic field, and this coil achieves the same function and effect as those of the air-core coil 141*a* in the fourth embodiment. The air-core coil 142*b* is disposed on the side of the sample holder 61 remote from the sample setting surface thereof, and outside the vacuum vessel 10, namely, in the atmosphere. As compared with the air-core coil 142*a* in the fourth embodiment, therefore, the air-core coil 142*b* affords superior characteristics istics in the aspects of heat radiation, vacuum sealing and maintenance.

Figure 20:
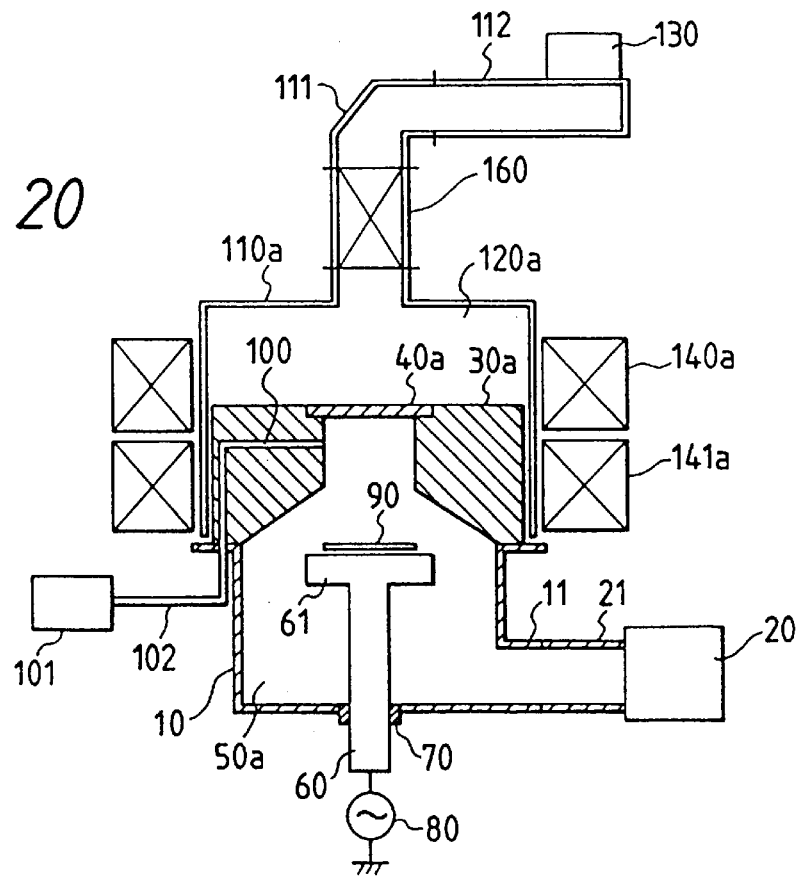
FIG. 20 is a vertical sectional view of portions of microwave plasma etching equipment in a sixth embodiment of the present invention.

FIG. 20 shows the sixth embodiment of the present invention. In FIG. 20, the same components and units as in FIG. 1 showing the first embodiment of the present invention, are indicated by the same symbols, and they shall be omitted from the present description.

In FIG. 20, numeral 160 designates a circular polarized wave transducer, which is interposed between the waveguide 110*a* and the waveguide 111.

In the construction of FIG. 20, microwaves transformed into a circular waveguide mode ($TE_{11}$ mode) by the waveguide 111 for a rectangular/circular-mode orthogonal transformation,are converted from linear polarized waves into circular polarized waves by the circular polarized wave transducer 160. The circular solarized waves are propagated to the waveguide 110*a* at the next stage, and are further propagated to the interior of the electric discharge block 30*a* through the microwave transmitting window 40*a*.

In addition to the effects of the first embodiment, this embodiment brings forth the effect that, owing to the use of the circular polarized wave transducer, the generation density of plasma within the electric discharge block can be raised several times the density in the first embodiment, whereby the processing rate of the sample can be further enhanced.

As a measure for raising the plasma density still more, an example utilizing the circular solarized waves has been explained in the sixth embodiment. As an alternative example, it is also effective to bring the operation of the magnetron into pulse discharge.

Figure 21:
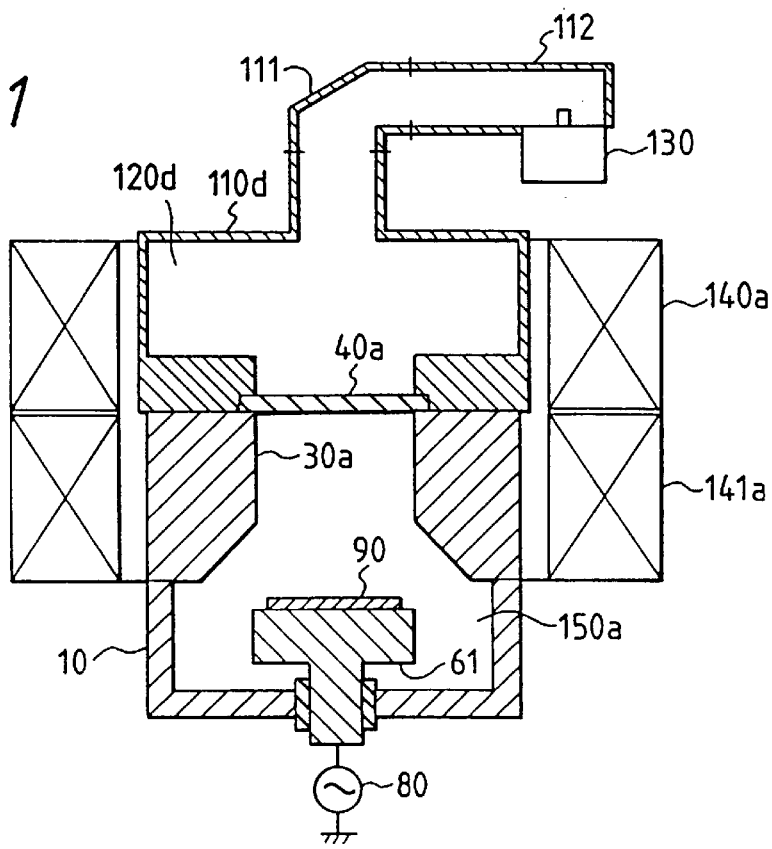
FIG. 21 is a vertical sectional view of portions of microwave plasma etching equipment in a seventh embodiment of the present invention.

FIG. 21 shows the seventh embodiment of the present invention, in FIG. 21, the same components and units as in FIG. 1 showing the first embodiment of the present invention are indicated by the same symbols, and they shall be omitted from the present description.

In the case of the first embodiment shown in FIG. 1, the means having the microwave matching function has been formed using the waveguide and part of the conductor wall of the electric discharge block. On the other hand, in this embodiment, as shown in FIG. 21, means having the microwave matching function is formed only of a waveguide 110d, and it is connected to the space 150a through the microwave transmitting window 40a.

With this embodiment, the same functions and effects as those of the first embodiment are attained.

Figure 22:
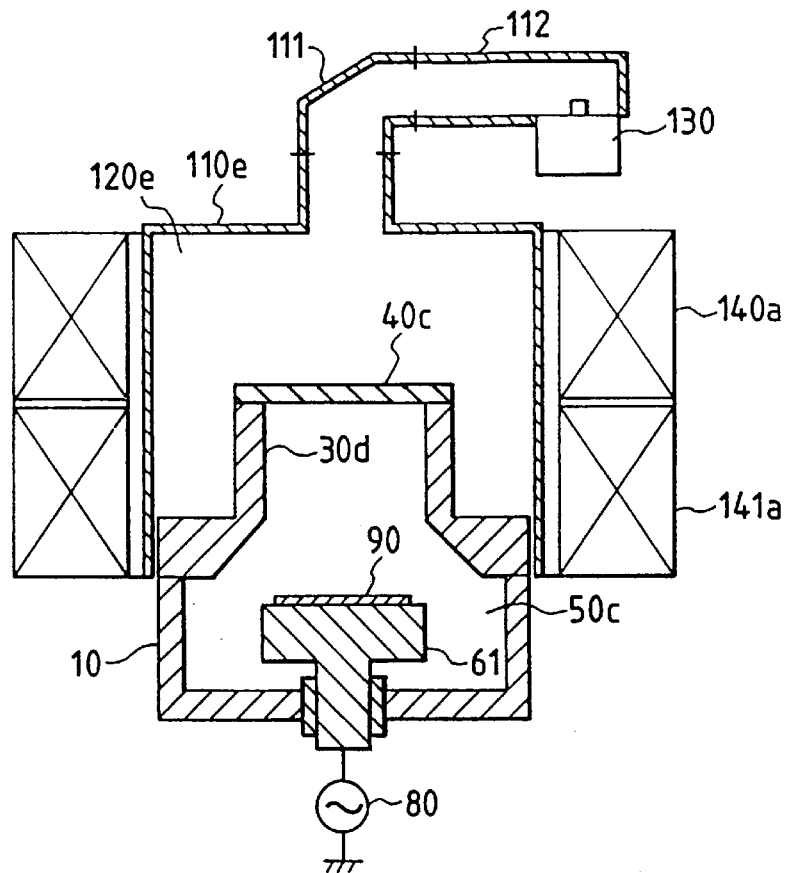
FIG. 22 is a vertical sectional view of portions of microwave plasma etching equipment in an eighth embodiment of the present invention.

Meanwhile, in the first and seventh embodiments, the cross-sectional shape of the means having the microwave matching function has been U-shaped with respect to the center axis. However, even when a microwave propagation region in a sectional view is in an L-shape with respect to the center axis as in the eighth embodiment shown in FIG. 22 or is in a T-shape (not shown) the same functions and effects as those of the first and seventh embodiments are attained.

Figure 23:
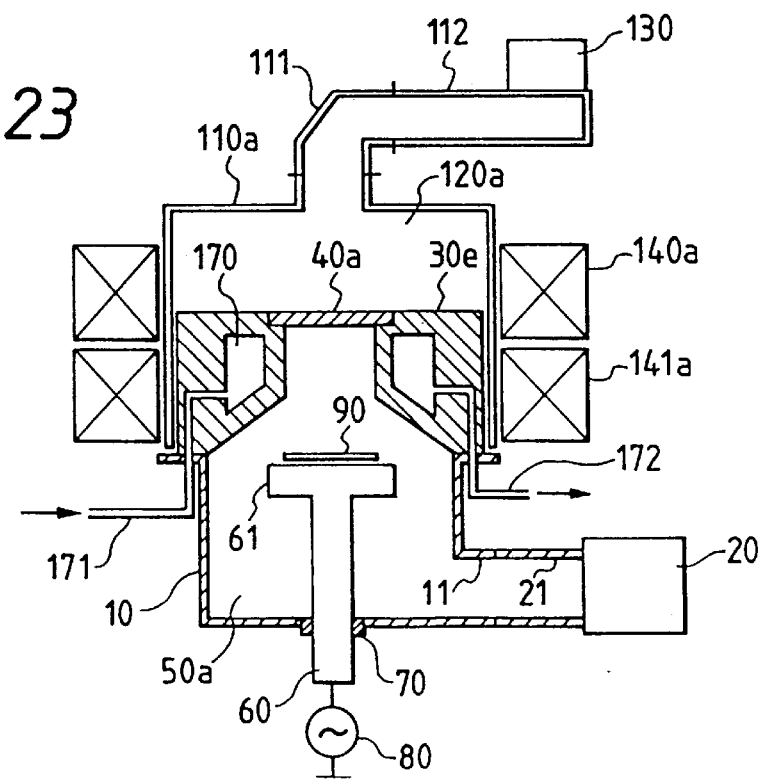

FIGS. 23–26 show the ninth embodiment of the present invention. In FIG. 23, the same components and units as in FIG. 1 showing the first embodiment of the present invention,are indicated by the same symbols, and they shall be omitted from the present description.

Referring to FIG. 23, a heat medium chamber 170 is formed in an electric discharge block 30e. The heat medium feed sort of the heat medium chamber 170 and a heat medium feeder (not shown) are connected by a heat medium feed pipe 171, and a heat medium discharge pipe 172 is connected to the heat medium discharge port of the heat medium chamber 170.

In the construction of FIG. 23, the heat medium chamber 170 is supplied with a heat medium at a predetermined temperature. Thus, the inner wall surface of the electric discharge block 30e exposed to plasma is heated. The other etching process operations of the sample are the same as in the first embodiment, and shall be omitted from the present description.

Figure 24:
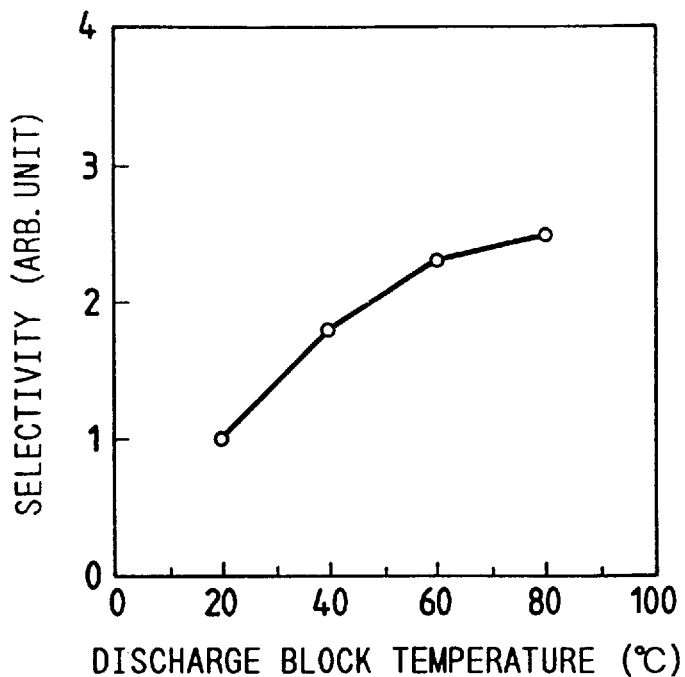

FIG. 24 is a graph obtained by investigating the influence, which was exerted on the selection ratio of the silicon oxide film of a sample 90 relative to the silicon film thereof, by the temperature of the inner wall surface of the electric discharge block 30e in the etching process of a silicon oxide film conducted using $CHF_3$ (gas flow rate: 50 cc/min) being one kind of fluorocarbon gas as an etching gas. In the graph of FIG. 24, the axis of ordinates represents the relative value of the selection ratio (relative selection ratio) in the case where the selection ratio of the silicon oxide film relative to the silicon film temperature of the temperature of the inner wall surface of the electric discharge block 30e was 20° C. is set at 1.0. As the other etching process conditions, the microwave power was 1 kW, the etching pressure was 5 mTorr, the RF power was 200 W, and the temperature of cooling water fed to the sample holder 61 was 20° C.

As seen in FIG. 24, the relative selection ratio is enhanced by raising the temperature of the inner wall surface of the electric discharge block 30e. By way of example, the relative selection ratio is enhanced about 1.7 times when the temperature of the inner wall surface of the electric discharge block 30e is 40° C., and it is enhanced about 2.3 times when the temperature of the inner wall surface of the electric discharge block 30e is 60° C. More specifically, since the deposition of plasma polymers such as $CF_4$ onto the inner wall surface of the electric discharge block 30e is relieved by heating this inner wall surface, the proportion of the polymers existent in the plasma enlarges to increase the amount of deposition of the plasma polymers onto the sample 90. In a case where the plasma polymers have deposited on the silicon oxide film of the sample 90, they are removed from this silicon oxide film by the reducing action of oxygen because the oxygen being a reductant is contained in the silicon oxide film. Therefore, the etching rate of the silicon oxide film does not lower. In contrast, in a case where the plasma polymers have deposited on the silicon film, the removal of the plasma polymers deposited on this silicon film is suppressed because no reductant exists in the silicon film. Therefore, the etching rate of the silicon film lowers. In consequence of these facts, the selection ratio of the silicon oxide film relative to the silicon film being a subbing film is enhanced. By the way, as the temperature of the inner wall surface of the electric discharge block is heightened, the relative selection ratio is enhanced, but the enhancement becomes saturated when the temperature of the inner wall surface of the electric discharge block is about 200° C.

This embodiment brings forth the following effects in addition to the effects of the first embodiment:

(1) In an etching process of a sample in which a silicon film and a silicon oxide film are stacked, and wherein a plasma of a fluorocarbon gas is employed, limitations which cannot be overcome by controlling the etching gas conditions can be overcome, and the selection ratio relative to the subbing silicon film can be enhanced.

(2) In an etching process of a sample in which a silicon film and a silicon oxide film are stacked, and wherein a plasma of a fluorocarbon gas is employed, deposition of plasma polymers onto the inner wall surface of the electric discharge block can be suppressed, so that the appearance of dust attributed to the peeling of the plasma polymers deposited on the inner wall surface of the electric discharge block, from this inner wall surface, can be suppressed, to prevent the lowering of the available percentage of the samples attributed to the dust.

Incidentally, in a case where, by way of example, mechanical clamp means is employed for setting the sample on the sample setting surface of the sample holder, it is also a member which is exposed to the plasma. From the viewpoint of enhancing the relative selection ratio, accordingly, also the mechanical clamp means should preferably be heated.

Figure 25:
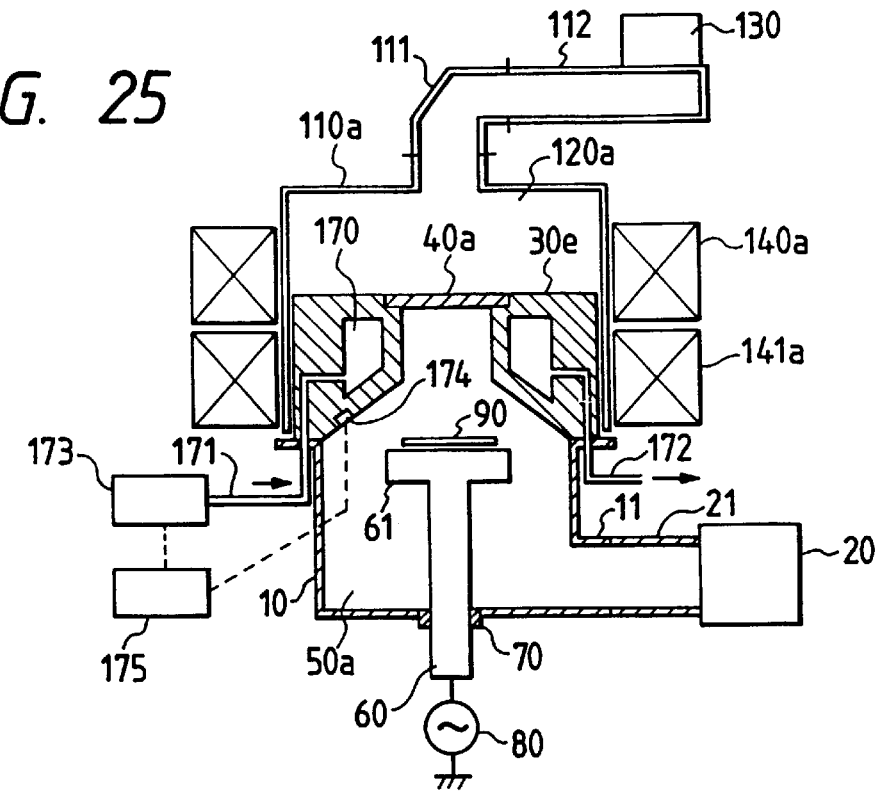

Next, in FIG. 25, the points of difference from FIG. 23 are that a heat medium feeder 173 has the function of varying the temperature of the heat medium, and that a heat medium temperature controller 175 to which the heat medium feeder 173 and a terminal 174 for detecting the temperature of the electric discharge block 30e are respectively connected is provided. In FIG. 25, the same components and units as in FIG. 23 are indicated by the same symbols, and they shall be omitted from the present description.

In the construction of FIG. 25, the inner wall surface of the electric discharge block 30e is heated and has its temperature regulated by the heat medium. More specifically, the temperature of the inner wall surface of the electric discharge block 30e changes during the etching process of the sample 90. Also, in case of successively subjecting the samples 90 to etching processes one by one, the temperature of the inner wall surface of the electric discharge block 30e changes. When the temperature of the inner wall surface of the electric discharge block 30e has changed in this manner, the amount of deposition of plasma polymers onto the inner wall surface changes. In consequence, the etching rate ratio between the silicon oxide film and the subbing silicon film of the sample 90 changes to change the selection ratio between them. Therefore, the temperature of the inner wall surface of the electric discharge block 30e is detected by the temperature detecting terminal 174, and the detected value is input to the heat medium temperature controller 175. In this heat medium temperature controller 175, a comparison is made between a desired constant value and the detected value of the temperature of the inner wall surface of the electric discharge block 30e, and the temperature of the heat medium is set in accordance with the result of the comparison. The set temperature is input to the heat medium feeder 173 as a control signal. Thus, the heat medium brought to the set temperature is supplied from the heat medium feeder 173 into the heat medium chamber 170, and the temperature of the inner wall surface of the electric discharge block 30e is regulated to the predetermined constant value. Such a temperature regulation for the inner wall surface of the electric discharge block 30e is performed during the etching process of the sample 90, or in the case of successively subjecting the sample 90 to etching processes one by one.

Figure 26:
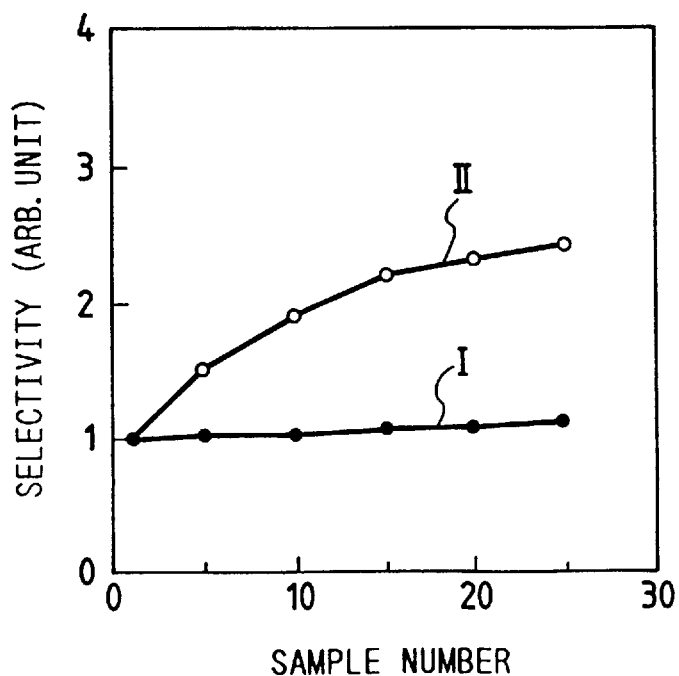

FIG. 26 shows the changes, with time, of the selection ratio of the silicon oxide film relative to the silicon film as exhibited (1) in a case where the temperature of the inner wall surface of the electric discharge block 30e was regulated to 20° C. and (2) in a case where it was not regulated. In FIG. 26, the axis of ordinates represents the relative value of the selection ratio (relative selection ratio with time) in the case where the selection ratio of the silicon oxide film of the first processed sample relative to the silicon film is set at 1.0. As the other etching process conditions, the microwave power was 1 kW, the etching pressure was 10 mTorr, the flow rate of an etching gas $CHF_3$) was 50 cc/min, the RF power was 200 W, and the temperature of cooling water fed to the sample holder 61 was 20° C.

As seen from FIG. 26, in the case where the temperature regulation for the inner wall surface of the electric discharge block 30e is performed, the relative selection ratio with time, relative to the silicon film, hardly changes (line I). In contrast, in the case where the temperature regulation for the inner wall surface of the electric discharge block 30e is not performed, the relative selection ratio with time relative to the silicon film in the 25th processed sample becomes about 2.4 times larger than the relative selection ratio relative to the silicon film in the first processed sample (line II). Besides, the above embodiment is not especially restrictive as the technique of the temperature regulation of a member to be exposed to plasma, for preventing the change of the relative selection ratio with time. Anyway, a member to be exposed to plasma may have its temperature regulated in order to prevent the change of the relative selection ratio with time.

In the above embodiment, the etching gas has been the fluorocarbon gas, and the sample has been one in which the silicon film and the silicon oxide film are stacked. Anyway, however, the embodiment is effectively applicable to a sample in which a film containing a component capable of removing deposited plasma polymers and a film incapable of removing the deposited plasma polymers are stacked.

Figure 27:
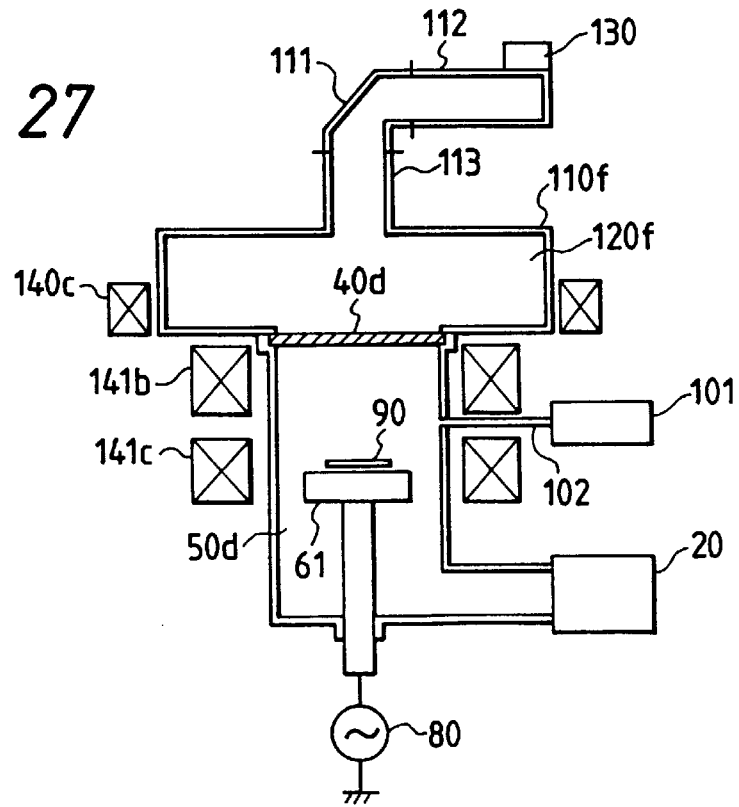
FIG. 27 is a vertical sectional view of portions of microwave plasma etching equipment in a tenth embodiment of the present invention.

FIG. 27 illustrates the tenth embodiment of the present invention.

In FIG. 27, the points of difference from FIG. 1 showing the first embodiment are that the electric discharge block in FIG. 1 is replaced with a mere cylinder which is a member forming a space 50d therein, and that a space 120f defined between the top wall of a waveguide 110f being a closed end wall and the top wall of the electric discharge block 30f serves as the internal space of a cylindrical cavity resonator. The member forming the space 50d, which includes the cylinder corresponding to the electric discharge block 30f, is made of a nonmagnetic electric conductor. In FIG. 27, the same components and units as in FIG. 1 are indicated by the same symbols, and they shall be omitted form the present description.

In the construction of FIG. 27, the microwaves oscillated by the microwave oscillator 130 are propagated to the space 120f of the cylindrical cavity resonator through the rectangular waveguide 112, the waveguide 111 for a rectangular/circular-mode orthogonal transformation, and a circular waveguide 113. The cylindrical cavity resonator is permitted to resonate the propagated microwaves in a specified electromagnetic field mode by appropriately selecting the inner diameter and length of the cylinder, and part of the microwaves of high energy density in the specified mode as obtained by the resonance is introduced into the space 50d through a microwave transmitting window 50d. In the space 50d, the etching gas is turned into a plasma by the interaction between the microwave electric field and the magnetic field. Here, the microwaves introduced into the space 50d have a high energy density in the stable specified mode, so that the plasma to be generated is also rendered high in density. Moreover, the plasma obtained is in a mode which is thought to substantially correspond to the microwave transmitting window 40d within the electromagnetic field distribution of the resonant mode. Accordingly, a plasma which has a high density and which is uniform is obtained without being affected by the state of the space 50d, and the surface to be etched of the sample 90 is subjected to an etching process by the diffusion of the plasma along a magnetic field gradient.

In this embodiment, by way of example, the diameter of the microwave transmitting window 40d is set at 200 mm, the inner diameter of the waveguide 110f at 270 mm, the mode of the cylindrical cavity resonator into $TE_{112}$, and the frequency of the microwaves at 2.45 GHz. Then, a plasma density which is, for example, about 5 times as high as that in the equipment disclosed in Japanese Patent Laid-Open No. 122217/1987 is attained in the space 50d having a diameter of 200 mm, and also the homogeneity of an etching process is sharply enhanced. By the way, in view of the dimension of the inner diameter of the space 50d, the sample 90 is restricted in size so as to be received and processed in this space. In principle, however, a sample 90 having a larger size can be treated by enlarging the aforementioned dimensions in similarity.

Figure 28:
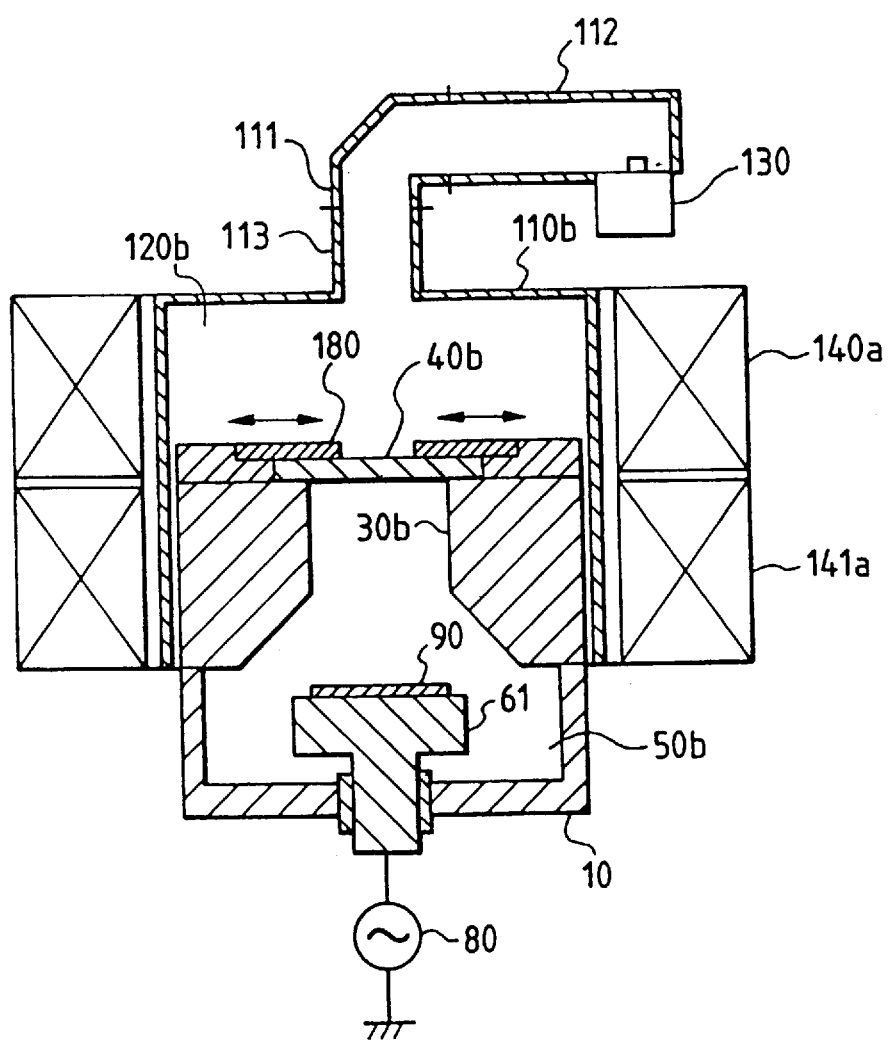
FIG. 28 is a vertical sectional view of portions of microwave plasma etching equipment in an eleventh embodiment of the present invention.

FIG. 28 illustrates the eleventh embodiment of the present invention.

In FIG. 28, the point of difference from FIG. 15, which shows the first example of the apparatus setup which regulates the interval L between the top surface of the electric discharge block 30b and the inner surface of the top wall of the waveguide 110b in the second embodiment, is that a diaphragm 180 is disposed in a space 120b having a microwave matching function, whereupon the matching is established by regulating the aperture for the diaphragm 180. This diaphragm 180 is fabricated of an electric conductor such as Al.

According to this embodiment, in addition to the effect of the first example in FIG. 15, there are brought forth the effects that the microwave matching unit can be fabricated more easily and that the matching can be promptly established owing to the high response rate of the movable portion.

Also in this embodiment, likewise to the first or second example of the apparatus setup in the second embodiment, the plasma density can be estimated by a measurement utilizing the light emission of the plasma or by a measurement utilizing the RF voltage, and the means having the microwave matching function can be controlled by the controller so as to generate a high density plasma. In addition, this embodiment is similarly applicable to an etching equipment having another construction, for example, the etching equipment of the construction shown in FIG. 17. In this case, the internal space of the waveguide overlying the electric discharge block need not always be the space having the microwave matching function. Besides, although the aperture of the diaphragm is regulable in this embodiment, it may well be fixed to a predetermined aperture.

In the forgoing embodiments, application of the present invention to microwave plasma etching equipment of the type having a magnetic field has been illustratively described. Needless to say, however, the present invention is similarly applicable to other equipment including a microwave CVD equipment of the type having a magnetic field, and a microwave plasma etching equipment, an ashing equipment and a CVD equipment of the type having no magnetic field. When the present invention is applied to the microwave CVD equipment in this manner, the homogeneity of a formed film is enhanced, and the rate of film formation can be enhanced.

According to the present invention, in processing a sample by the use of a microwave plasma processing apparatus in which a waveguide section includes electric discharge means isolated from a waveguide for the propagation of microwaves and having a plasma generation region therein, there is brought forth the effect that the uniformity of a plasma density distribution corresponding to the surface of the sample to be processed can be sharply enhanced, so the homogeneity of the processing of the surface to be processed, which utilizes a plasma, can be enhanced.

Besides, according to the present invention, along with the above effect that the homogeneity of the processing can be enhanced, there is brought forth the effect that, since ions to enter the surface to be processed can be accelerated and the density of the plasma can be increased, the processing rate of the sample can be increased.

Further, according to the present invention, along with the above effect that the homogeneity of processing the surface to be processed can be enhanced, there is brought forth the effect that, since the plasma density can be increased, the acceleration energy of the ions for the sample can be suppressed to low levels, to enhance the processing with only light damage.

As discussed in connection with the tenth embodiment with respect to FIG. 27, according to one aspect of the present invention a cavity resonator (oscillator), e.g., a cylindrical cavity resonator, is used so as to resonate the propagated microwaves in a specified electromagnetic field mode, with such microwaves being passed into the plasma generating chamber; according to the present invention, of the microwaves in such resonator the microwaves of a predetermined electromagnetic field mode are supplied to the processing (plasma generating) chamber, so as to form a plasma with improved homogeneity and stability. Specifically, microwaves of $TE_{11}$ mode are introduced into the processing chamber, so as to provide uniform electric lines of forces so as to form a more homogeneous and stable plasma.

Desirably, microwaves of a single mode (e.g., $TE_{11}$ mode), or at least substantially of a single mode, are supplied to the processing chamber. Where microwaves having different modes are supplied, instability in the plasma can occur. Introduction of different modes creates changes in the plasma density and impedance of current through the plasma. Moreover, a change in impedance will act to change the mode of the microwaves so as to match the impedance. Accordingly, microwaves of only the single mode (or at least substantially only of the single mode) should desirably be introduced so as to provide a more stable plasma.

In order to introduce microwaves of only a single mode (e.g., of $TE_{11}$) into the processing chamber, desired coupling between the microwave oscillator (space 120f in FIG. 27) and the processing chamber (space 50d in FIG. 27) is provided so as to cut off all modes other than the desired mode. Such coupling can be, e.g., an opening between the two spaces, covered by a microwave transmitting window. For example, a diameter of the entrance to the processing chamber, from the oscillator, is smaller than the diameter of the oscillator, so as to cut off modes in the oscillator other than the desired mode. Illustratively, the oscillator has microwaves of circular $TE_{12}$ mode. The coupling (e.g., provided by a coupler) between the oscillator and processing chamber cuts off microwaves other than a circular $TE_{11}$ mode, so as to supply to the processing chamber substantially only microwaves having a circular $TE_{11}$ mode, whereby stability of the plasma formed in the processing chamber is increased.

In the foregoing illustration the oscillator (cavity resonator) resonates with microwaves of the circular $TE_{12}$ mode. Thus, microwaves generated by a microwave generator are passed to the oscillator, which has dimensions (e.g., a diameter and length) such that microwaves of modes other than $TE_{12}$ are cut off. The mode in the resonator can be controlled by controlling, e.g., the length and diameter of the oscillator, as is known in the art.

While in the foregoing illustration the oscillator has cut off all generated microwaves other than microwaves of circular $TE_{12}$ mode, the present invention is not limited to such oscillator. The oscillator can resonate at any mode as long as microwaves of the desired mode can be transmitted, e.g., by the coupler, and introduced into the processing chamber, while the microwaves of other modes can be blocked from being transmitted to the processing (plasma generating) chamber. For example, the oscillator can provide microwaves of, e.g., circular $TE_{12}$, $TE_{13}$, $TE_{14}$, etc., mode, and the coupler can cut off microwaves of a mode other than circular $TE_{11}$ mode, for introducing microwaves substantially only of $TE_{11}$ mode into the processing chamber. Thus, the oscillator can provide microwaves at modes other than the desired circular $TE_{11}$ mode, with the coupler passing only the desired circular $TE_{11}$ mode to the processing chamber; the present invention provides for choosing the coupling (coupler) between the oscillator and processing chamber so as to attain more homogeneous and stable plasmas in the processing chamber.

In the following paragraphs, operation of this aspect of the present invention will be described. Such description is illustrative of the present invention, and not limiting, the present invention being defined by the appended claims.

Internally of the $TE_{12}$ oscillator which is installed in a transmitting direction of microwaves between microwave generation and the plasma generation chamber, microwaves having modes other than a circular $TE_{12}$ mode are cut off, and only microwaves having the circular $TE_{12}$ mode exist. Among lines of electric force in the circular $TE_{12}$ mode, only lines of electric force existing in a circle having a radius of 0.345 times the external radius, from the center of the oscillator, coincide with lines of electric force of a circular $TE_{11}$ mode. Accordingly, a diametral ratio of the coupler and the $TE_{12}$ oscillator is selected to be 0.345, the axis of the oscillator is made to coincide with that of the coupler, and the $TE_{12}$ oscillator operates so as to supply microwaves of $TE_{11}$ mode stably into the coupler by arranging the $TE_{12}$ oscillator and said coupler in the above-described order in a microwave transmitting direction. On the other hand, the microwave supplied into the coupler, and hence into the processing chamber, reacts with a magnetic field which is generated in an axial direction and generates plasma by causing electron cyclotron resonance. Furthermore, because an electric field having a vertical direction to the magnetic field, among electric fields of the microwaves, contributes to the above-described electron cyclotron resonance, it is preferable to supply microwaves of TE mode into the discharge tube in order to generate high density plasma. Therefore, microwaves of the circular $TE_{11}$ mode can be supplied stably into the coupler and processing chamber by using the $TE_{12}$ oscillator, and accordingly, a homogeneous and stable high-density plasma can be generated, and a homogeneous, fast plasma processing becomes possible.

In the following paragraphs, this aspect of the present invention will be described in connection with specific and preferred embodiments. These embodiments are illustrative of the present invention and not limiting, it being intended that the present invention cover all alterations, modifications and equivalents as may be included within the spirit and scope of the invention as defined by the appended claims.

Figure 29:
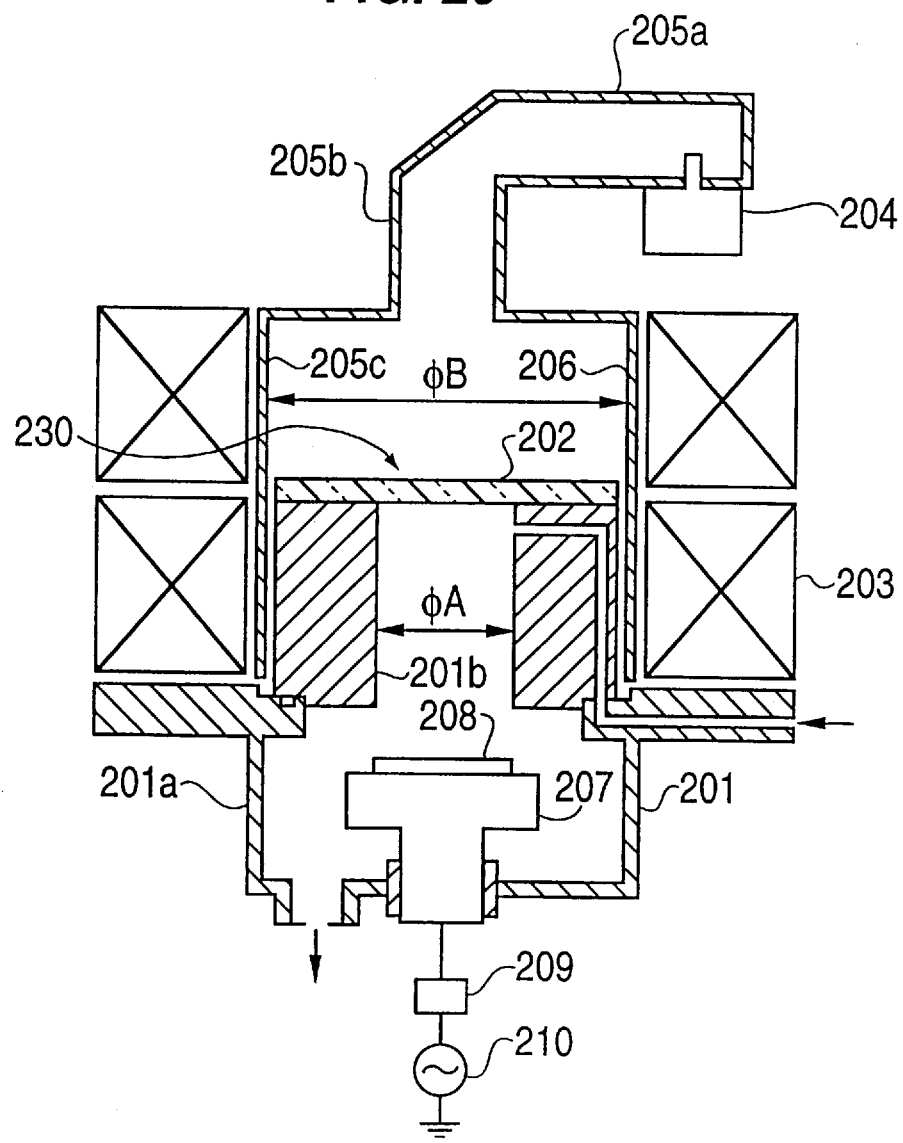
FIG. 29 is a vertical sectional view of portions of microwave plasma etching equipment (including a processing chamber portion of microwave dry etching apparatus), in an eleventh embodiment of the present invention.

The twelfth embodiment of the present invention is explained hereinafter using FIG. 29. FIG. 29 indicates schematically a construction of a microwave dry etching apparatus having a magnetic field, which is the twelfth embodiment of the present invention. After an internal space of the processing chamber 201 (which is partitioned with the vessel 201a, the discharge block 201b and the quartz window 202) is evacuated using a vacuum apparatus (not shown in the drawing), an etching gas is supplied from a gas supply apparatus (not shown in the drawing) into the processing chamber 201, and pressure of the etching gas is adjusted to a desired value. The processing chamber is located in a magnetic field which is generated by the coil 203. A microwave of 2.45 GHz generated by the magnetron 204, for example, is propagated through the waveguide tubes 205a, 205b, passes through the $TE_{12}$ oscillator which is composed of a space surrounded with the waveguide tube 205c and the discharge block 201b, further passes through the quartz window 202 of the coupler 230 between the oscillator 206 and the processing chamber 201, and is projected into the passage through the discharge block 201b where a plasma is generated. With the plasma generated by the projection of the microwave, the material 208 for processing, placed on the sample holder 207, is processed. In order to control etching shapes of the material 208 for processing, the high frequency power source 210 is connected to the sample holder 207 via the matching device 209, and high frequency voltage is charged.

Internally of the $TE_{12}$ oscillator 206, which is installed in the transmitting portion (path) of the microwaves, microwaves in modes other than the circular $TE_{12}$ mode are cut off and only microwaves in the circular $TE_{12}$ mode exist. Among lines of electric force in the circular $TE_{12}$ mode, only lines of electric force existing in a circle having a radius of 0.345 times the external radius, from the center, of oscillator 206, coincide with lines of electric force of the circular $TE_{11}$ mode. Accordingly, a ratio of the diameter φA of the discharge block 201b (diameter of the coupler 230) and the diameter φB of the $TE_{12}$ oscillator 206 is selected to be 0.345, and the axis of the $TE_{12}$ oscillator 206 is made to coincide with that of the discharge block 201b, such that the oscillator 206 is coupled by coupler 230 to the processing chamber 201 so the $TE_{12}$ oscillator supplies microwaves of $TE_{11}$ mode stably into the discharge block 201b by arranging the $TE_{12}$ oscillator 206 and the discharge block 201b in the above-described order in a microwave transmitting direction.

On the other hand, the microwaves supplied into the discharge block 201b reacts with an external magnetic field which is generated in an axial direction, and generates plasma by causing electron cyclotron resonance. Furthermore, because only an electric field having a vertical direction to the magnetic field among electric fields of the microwaves contributes to the above-described electron cyclotron resonance, it is preferable to supply microwaves of TE mode into the discharge block in order to generate high-density plasma. Therefore, in accordance with the present invention, microwaves of the circular $TE_{11}$ mode, having a homogeneous electric field and a wide range, can be supplied stably by using the $TE_{12}$ oscillator and coupling such oscillator with the discharge block which generates plasma; and accordingly, homogeneous, high-density plasma can be generated, and a homogeneous, fast plasma processing becomes possible.

In accordance with the present embodiment, there is an advantage such that the homogeneous, fast plasma processing becomes possible because the microwave in circular $TE_{11}$ mode can be supplied stably into the discharge block 201b.

In the above-described twelfth embodiment, the ratio of the diameter φA of the discharge block 201b and the diameter φB of the $TE_{12}$ oscillator 206 was selected to be 0.345. However, even if the ratio of φA and φB is selected to be a value in a range from 0.1 to 0.6, nearly the same advantage as the twelfth embodiment can be realized because substantially all of the microwaves propagating in the discharge block 201b is in the circular $TE_{11}$ mode.

Reference is made in the foregoing to diameter φA of the discharge block 201b (specifically, inner hollow of this discharge block). Note that this diameter φA is the diameter both of the opening, covered by microwave transmitting window 202, and of the discharge block, and that where the diameters of the opening and inner hollow are the same microwaves of substantially only the desired mode can be transmitted by selecting dimensions (e.g., diameter) of the discharge block relative to that of the resonator cavity.

Figure 30:
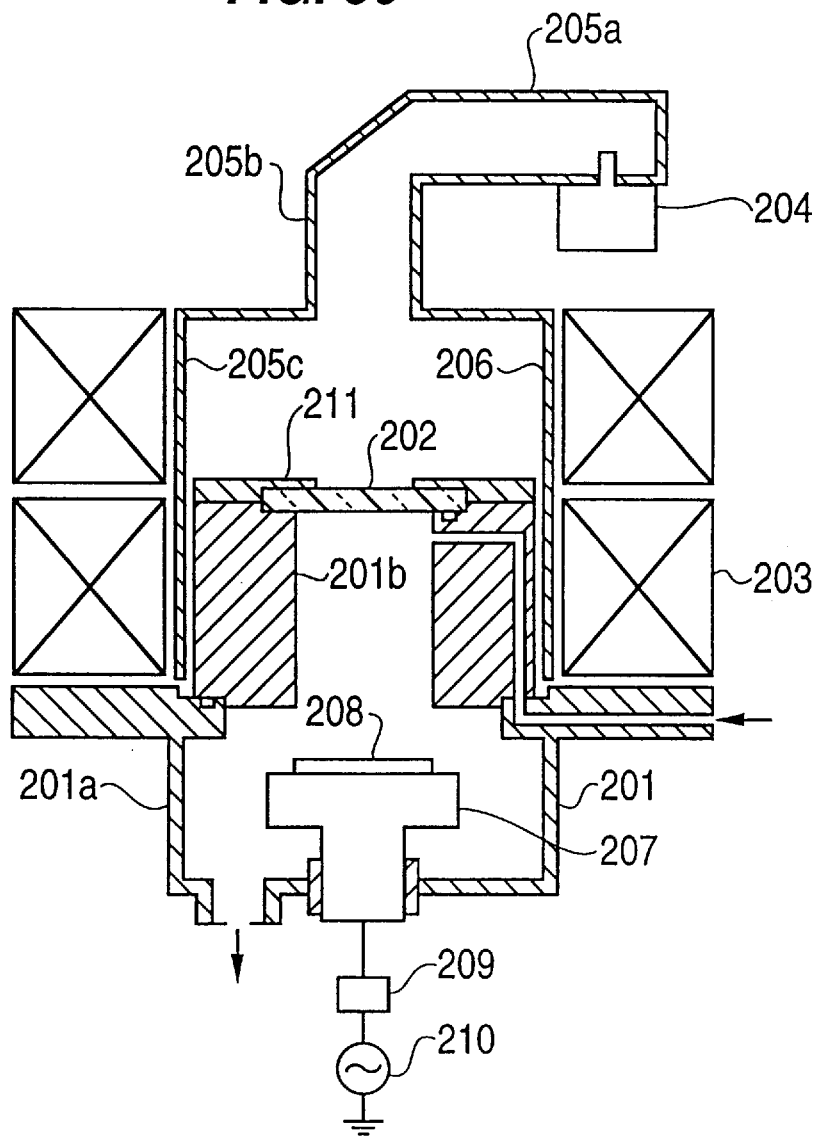
FIG. 30 is a vertical sectional view of portions of microwave plasma etching equipment (including a processing chamber portion of microwave dry etching apparatus), in a twelfth embodiment of the present invention.

The thirteenth embodiment of the present invention is explained hereinafter using FIG. 30.

In the present embodiment, the iris 211, which was composed of doughnut-shaped circular plates made from conductive material, such as aluminum, for example, was installed on the discharge block 201b and the quartz window 202, and the $TE_{12}$ oscillator 206 was composed of the iris 211 and the waveguide tube 205c. Because microwaves can be supplied effectively into a plasma in the discharge block 201b, which is a load, generation of further high-density plasma becomes possible. Therefore, in accordance with the present embodiment, another advantage, that further increased speed of plasma processing becomes possible, can be realized in addition to the advantage brought by the twelfth embodiment.

Figure 31:
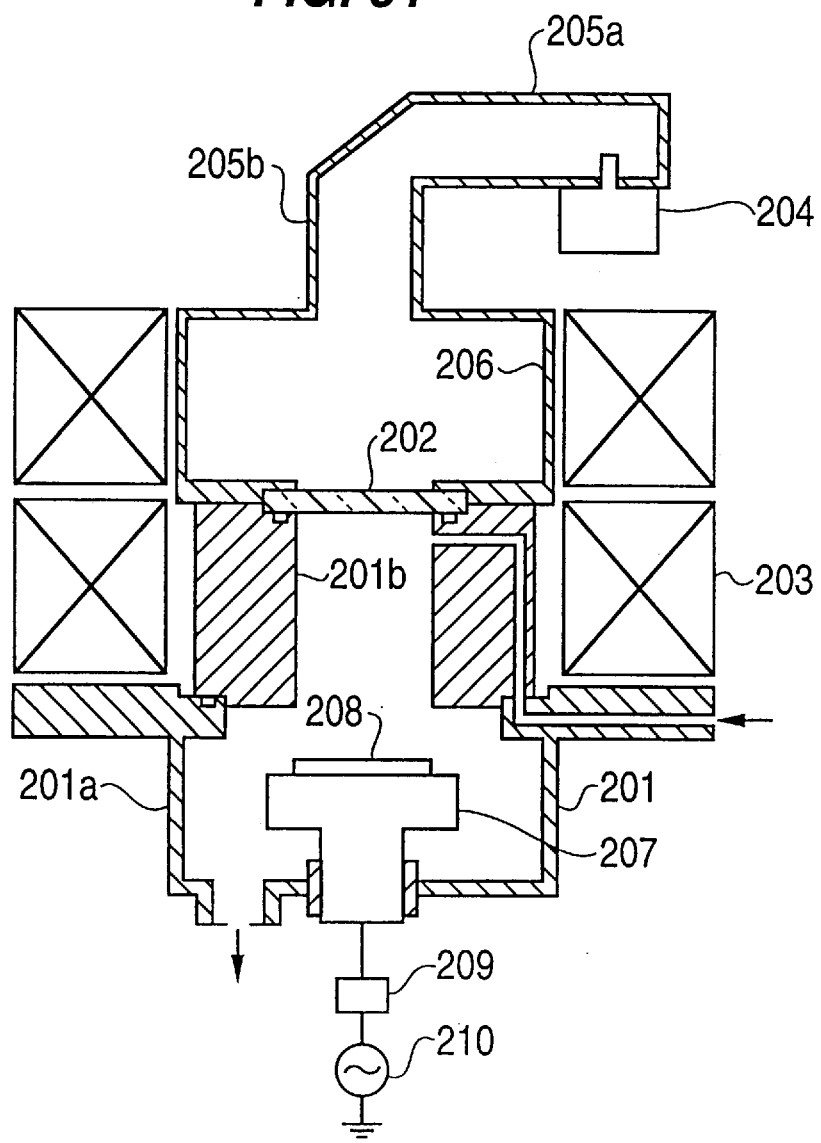
FIG. 31 is a vertical sectional view of portions of microwave plasma etching equipment (including a processing chamber portion of microwave dry etching apparatus), in a thirteenth embodiment of the present invention.

The fourteenth embodiment of the present invention is explained hereinafter using FIG. 31. In the present embodiment, the $TE_{12}$ oscillator 206 is manufactured independently, and the same advantage as that of the twelfth embodiment is realized.

Figure 32:
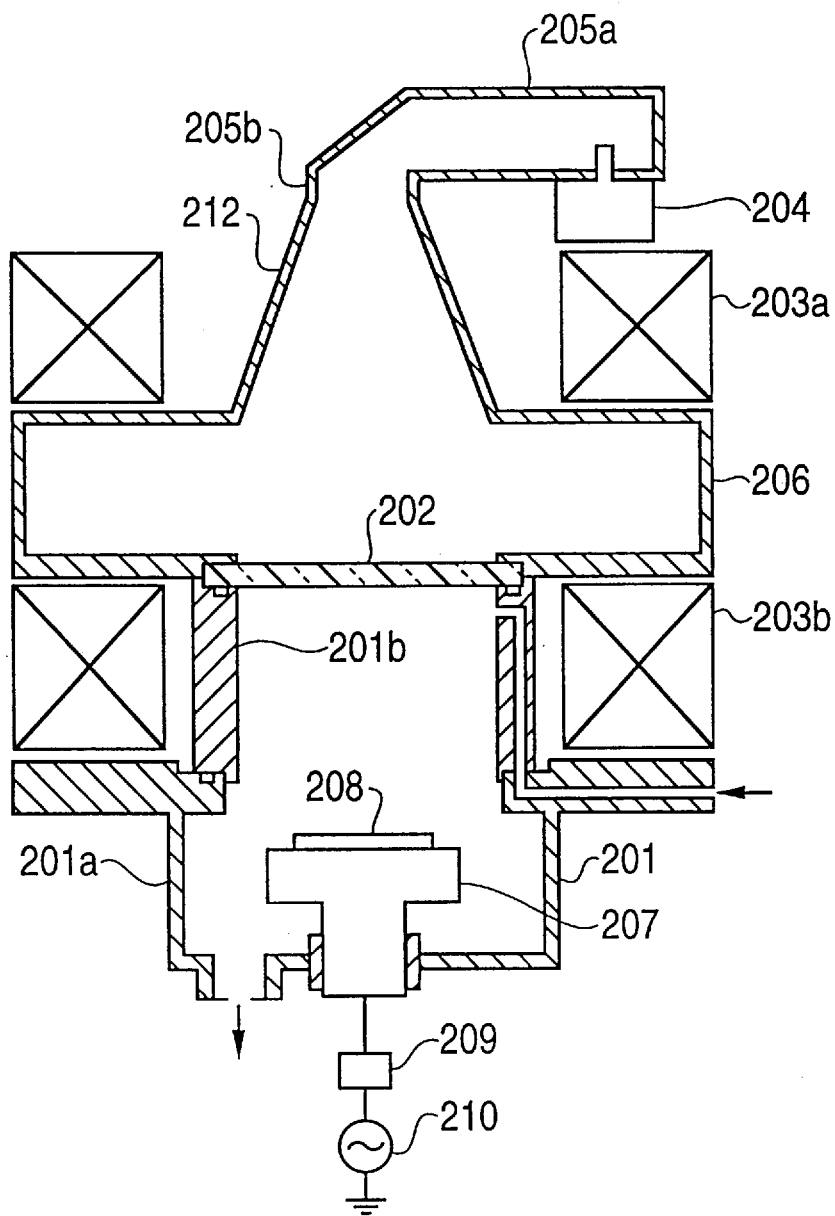
FIG. 32 is a vertical sectional view of portions of microwave plasma etching equipment (including a processing chamber portion of microwave dry etching apparatus), in a fourteenth embodiment of the present invention.

The fifteenth embodiment of the present invention is explained hereinafter using FIG. 32. In the present embodiment, the $TE_{12}$ oscillator 206 is installed between the coil 203a and the coil 203b.

Microwaves generated from the magnetron 204 are supplied to the $TE_{12}$ oscillator 206 through the waveguide tube 205a, 205b and the tapered waveguide tube 212. In accordance with the present embodiment, an advantage is realized that a material 208 to be processed, having a large area, can be processed homogeneously, in addition to the advantage of the twelfth embodiment, because the $TE_{12}$ oscillator 206 of large-size can be installed; and accordingly, an inner diameter φA of the discharge block 201b, wherein plasma is generated, can be enlarged.

Figure 33:
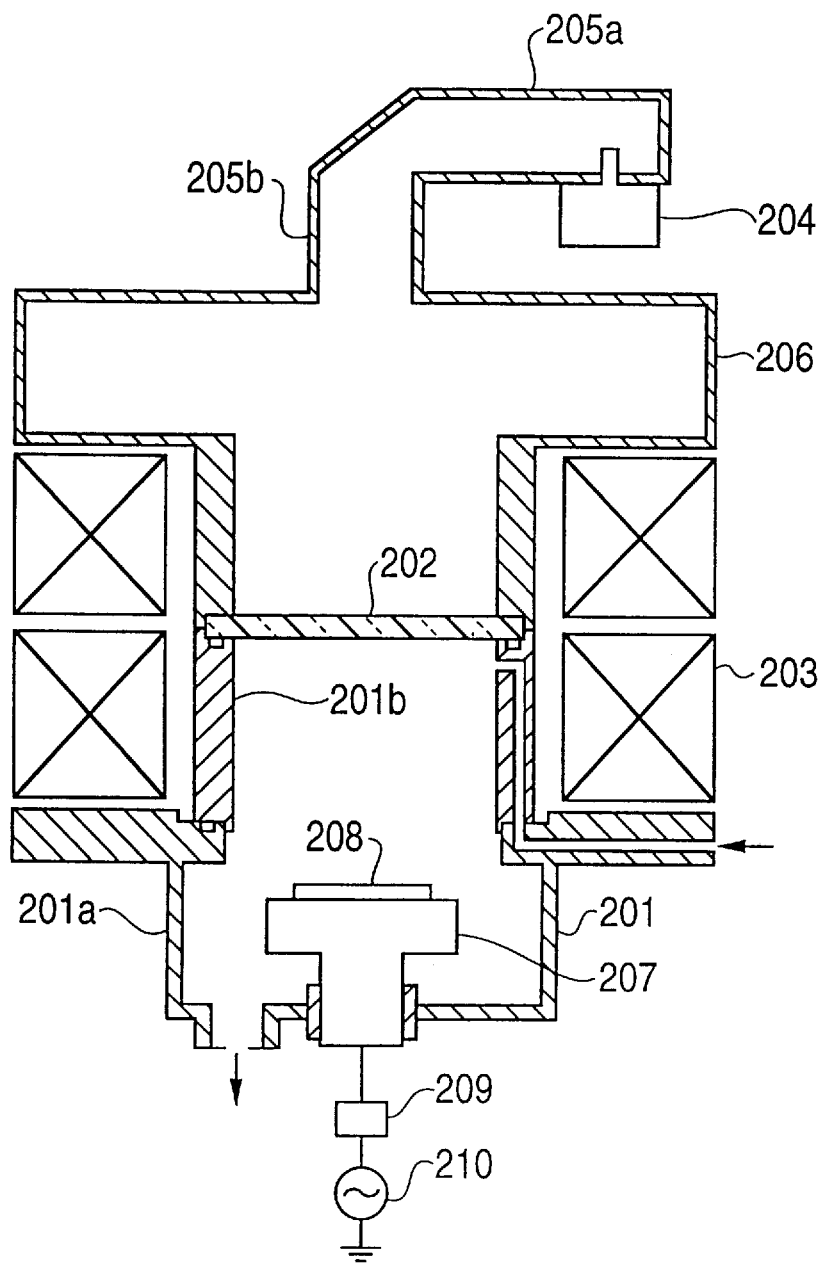
FIG. 33 is a vertical sectional view of portions of microwave plasma etching equipment (including a processing chamber portion of microwave dry etching apparatus), in a fifteenth embodiment of the present invention.

The sixteenth embodiment of the present invention is explained hereinafter using FIG. 33. In the present embodiment, the $TE_{12}$ oscillator 206 is installed on the coil 203. In accordance with the present embodiment, the same advantage as that of the fourth embodiment can be realized because the inner diameter φA of the discharge block 201b can be enlarged.

In each of the above embodiments twelve through sixteen, a dry etching apparatus having a magnetic field was explained. However, the same operation and advantages as that of the above embodiments can be realized with other plasma processing apparatus such as dry etching apparatus utilizing microwaves, plasma CVD apparatus, and ashing apparatus.

In accordance with the present invention, microwaves having a circular $TE_{11}$ mode can be supplied stably into a discharge block wherein plasma is generated, and accordingly, high-density plasma is generated, and homogeneous, fast plasma processing becomes possible.

While we have shown and described several embodiments in accordance with the present invention, it is understood that the same is not limited thereto, but is susceptible to numerous changes and modifications as known to one having ordinary skill in the art, and we therefore do not wish to be limited to the details shown and described herein, but intend to cover all such modifications as are encompassed by the scope of the appended claims.

What is claimed is:

1. A plasma processing apparatus for generating a plasma in response to microwaves supplied to a plasma generating chamber, comprising:
   a microwave generator for generating microwaves;
   a waveguide for guiding said microwaves to an end thereof;
   a cavity resonator connected to said end of said waveguide, for resonating said microwaves, supplied through said waveguide, at a first mode;
   a microwave transmitting window; and
   the plasma generating chamber, for generating said plasma by using at least a part of said microwaves supplied from said cavity resonator, wherein said microwaves in the cavity resonator are transferred to the plasma generating chamber through only said microwave transmitting window, wherein the cavity resonator is connected to the plasma generating chamber by a connector, such that microwaves can pass from the cavity resonator to the plasma generating chamber via the connector, both the cavity resonator and the connector having a diameter, and wherein a ratio of the diameter of the connector to the diameter of the cavity resonator is 0.1 to 0.6.

2. A plasma processing method for generating a plasma in a plasma generating chamber in response to microwaves supplied to the plasma generating chamber, comprising the steps of:
   generating microwaves;
   guiding said microwaves to a cavity resonator in which microwaves are resonated at a first mode;
   extracting microwaves from said cavity resonator and transmitting the extracted microwaves to the plasma generating chamber through only a microwave transmitting window; and
   interacting a gas with the microwaves transmitted to the plasma generating chamber so as to generate the plasma, wherein the first mode of the microwaves, in the cavity resonator, is different than a mode of the microwaves in the plasma generating chamber.

3. A plasma processing method as defined in claim 2, wherein the extracted microwaves are transmitted from the cavity resonator to the plasma generating chamber via a single window which is said microwave transmitting window, said single window being provided in an electric discharge structure between the cavity resonator and the plasma generating chamber.

4. A plasma processing apparatus for generating a plasma in response to microwaves supplied to a plasma generating chamber, comprising:
   a microwave generator for generating microwaves;
   a waveguide for guiding said microwaves to an end thereof;
   a cavity resonator connected to said end of said waveguide, for resonating said microwaves, supplied through said waveguide, at a first mode;
   a microwave transmitting window; and
   the plasma generating chamber, for generating said plasma by using at least a part of said microwaves supplied from said cavity resonator, wherein said microwaves in the cavity resonator are transferred to the plasma generating chamber through only said microwave transmitting window, wherein the plasma generating chamber and the cavity resonator are connected such that microwave of a second mode are transferred to the plasma generating chamber, and wherein said first mode is $TE_{12}$ and said second mode is $TE_{11}$.

5. A plasma processing apparatus for generating a plasma in response to microwaves supplied to a plasma generating chamber, comprising:
   a microwave generator for generating microwaves;
   a waveguide for guiding said microwaves to an end thereof;
   a cavity resonator connected to said end of said waveguide, for resonating said microwaves, supplied through said waveguide, at a first mode;
   a microwave transmitting window; and
   the plasma generating chamber, for generating said plasma by using at least a part of said microwaves supplied from said cavity resonator, wherein said microwaves in the cavity resonator are transferred to the plasma generating chamber through only said microwave transmitting window, wherein the plasma generating chamber and the cavity resonator are connected such that microwaves of a second mode are transferred to the plasma generating chamber, and wherein the second mode is a different mode than the first mode, the second mode being a mode lower in order than said first mode.

6. A plasma processing method for generating a plasma in a plasma generating chamber in response to microwaves supplied to the plasma generating chamber, comprising the steps of:

generating microwaves;

guiding said microwaves to a cavity resonator in which microwaves are resonated at a first mode;

extracting microwaves from said cavity resonator and transmitting the extracted microwaves to the plasma generating chamber through only a microwave transmitting window; and interacting a gas with the microwaves transmitted to the plasma generating chamber so as to generate the plasma, wherein the plasma generating chamber and the cavity resonator are connected such that microwaves of a second mode are extracted from the cavity resonator and transmitted to the plasma generating chamber, and wherein the first mode is $TE_{12}$, and the second mode is $TE_{11}$.

* * * * *